United States Patent [19]
Minato

[11] Patent Number: 5,493,504
[45] Date of Patent: Feb. 20, 1996

[54] SYSTEM AND METHOD FOR PROCESSING LOGIC FUNCTION AND FAULT DIAGNOSIS USING BINARY TREE REPRESENTATION

[75] Inventor: Shin-ichi Minato, Zama, Japan

[73] Assignee: Nippon Telegraph and Telephone Corporation, Tokyo, Japan

[21] Appl. No.: 141,677

[22] Filed: Oct. 27, 1993

[30] Foreign Application Priority Data

Oct. 28, 1992 [JP] Japan .................................. 4-290049

[51] Int. Cl.$^6$ .................................................. H01L 25/00
[52] U.S. Cl. .......................... 364/488; 364/489; 364/490; 364/491
[58] Field of Search ..................................... 364/488, 489, 364/490, 491, 578

[56] References Cited

U.S. PATENT DOCUMENTS

| | | | |
|---|---|---|---|
| 4,086,628 | 4/1978 | Woodrum | 364/200 |
| 4,651,284 | 3/1987 | Watanabe et al. | 364/491 |
| 4,831,543 | 5/1989 | Mastellone | 364/489 |
| 4,918,614 | 4/1990 | Modarres et al. | 364/490 |
| 5,216,423 | 6/1993 | Mukherjee | 341/79 |
| 5,263,124 | 11/1993 | Weaver et al. | 382/37 |
| 5,272,704 | 12/1993 | Tong et al. | 371/23 |

OTHER PUBLICATIONS

R. E. Bryant, "Graph-Based Algorithms for Boolean Function Manipulation", *IEEE Trans. Comput.*, 1986, vol. C-35, No. 8, pp. 677-691.

T. Sasao, "Logic Synthesis and Optimization", *Kluwer Academic Publishers*, 1993, Chapter 2, pp. 36-38.

R. K. Brayton et al, "Logic Minimization Algorithms for VLSI Synthesis", *Kluwer Academic Publishers*, 1984, Cover page and table of contents.

N. Takahashi et al, "Fault Simulation for Multiple Faults Using Shared BDD Representation of Fault Sets", *Processing of IEEE/ACM ICCAD*, 1991, pp. 550-553.

Shin-ichi Minato, "Zero-Suppressed BDDs for Set Manipulation in Combinatorial Problems", *30th ACM/IEEE Design Automation Conference*, 1993, pp. 272-277 (with two Japanese publications).

*Primary Examiner*—Kevin J. Teska
*Assistant Examiner*—Stephen J. Walder, Jr.
*Attorney, Agent, or Firm*—Spencer & Frank

[57] ABSTRACT

A design system of a logic circuit including a logic synthesis and processing unit and a set data processing unit. The set data processing unit includes a node table which records elements of a set. A control unit of the logic synthesis and processing unit reads set data from the node table, assigns a binary number to each element, and transfers them to a control unit of the set data processing unit. The control unit of the set data processing unit separates the set data in accordance with 0 and 1 of individual digits of the binary numbers, generates a 0-suppressed binary decision diagrams of a logic function, and stores them to the node table. In generating the 0-suppressed binary decision diagram, node sharing and 0-suppress node elimination are applied. The 0-suppress node elimination is applied to each intermediate node having edges e0 and e1, which are associated with 0 and 1 of each position of digits. When the edge e1 of an intermediate node points to a 0-terminal node, the intermediate node, the edge e1, and the 0-terminal node are eliminated, and an edge pointing the intermediate node is directly connected to e0 of the intermediate node. The 0-suppressed binary decision diagram is formed in the node table. A subset whose element number is considerably smaller than that of the entire set can be represented by a graph which includes a smaller number of nodes than a conventional binary decision diagram.

14 Claims, 20 Drawing Sheets

(a)        (b)

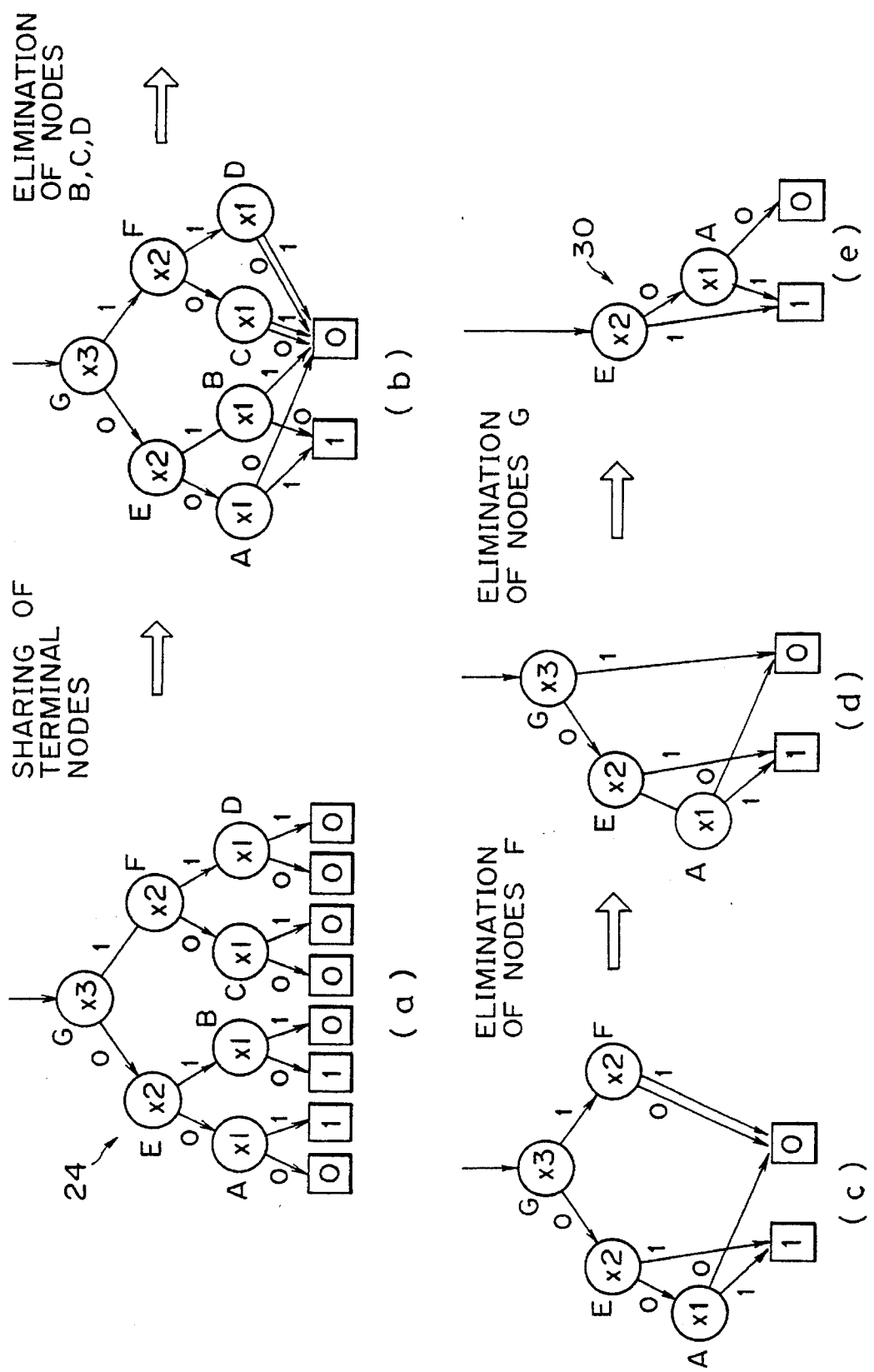

| 1 | 2 | 3 | 4 | 5 | 6 | 7 | 8 | 9 | 10 | ----- |
|---|---|---|---|---|---|---|---|---|----|-------|
| a | $\bar{a}$ | b | $\bar{b}$ | c | $\bar{c}$ | d | $\bar{d}$ | e | $\bar{e}$ | |

ORDERING TABLE ~62

FIG. 13

| | | | | | | |
|---|---|---|---|---|---|---|
| 63 ↘ | — | — | $t_1$ | $t_1$ | $N_1$ | $t_1$ | --- |
| | — | — | $t_0$ | $t_0$ | $t_0$ | $N_2$ | --- |
| | — | — | a | c | $\bar{b}$ | a | --- |
| | $t_0$ | $t_1$ | $N_0$ | $N_1$ | $N_2$ | $N_3$ | |

FIG. 14C

| | | | | | |
|---|---|---|---|---|---|
| 63 ↘ | — | — | $t_1$ | $t_1$ | $N_1$ | --- |
| | — | — | $t_0$ | $t_0$ | $t_0$ | --- |
| | — | — | a | c | $\bar{b}$ | --- |
| | $t_0$ | $t_1$ | $N_0$ | $N_1$ | $N_2$ | |

FIG. 14B

| | | | |
|---|---|---|---|
| 63 ↘ | — | — | $t_1$ | --- |
| | — | — | $t_0$ | --- |
| | — | — | a | --- |
| | $t_0$ | $t_1$ | $N_0$ | |

FIG. 14A

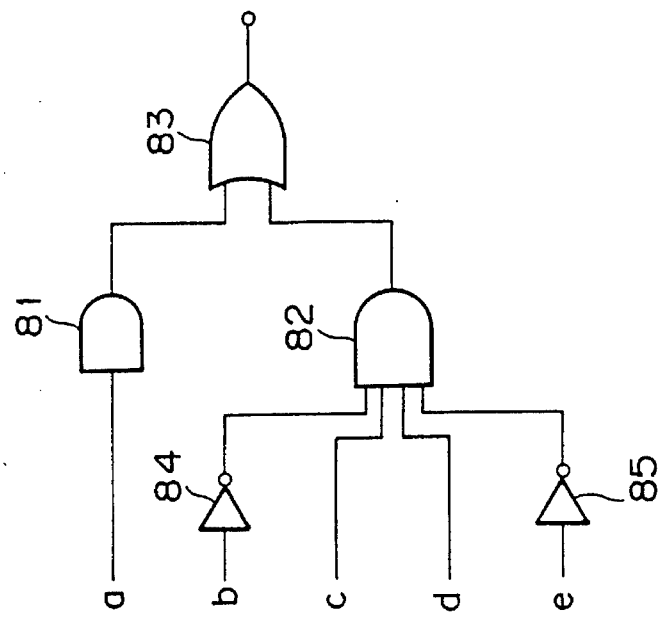
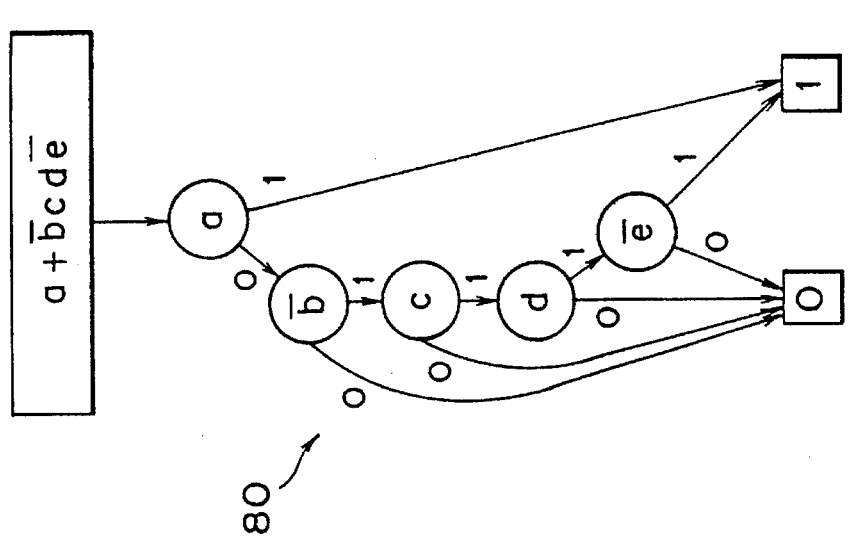
FIG. 19

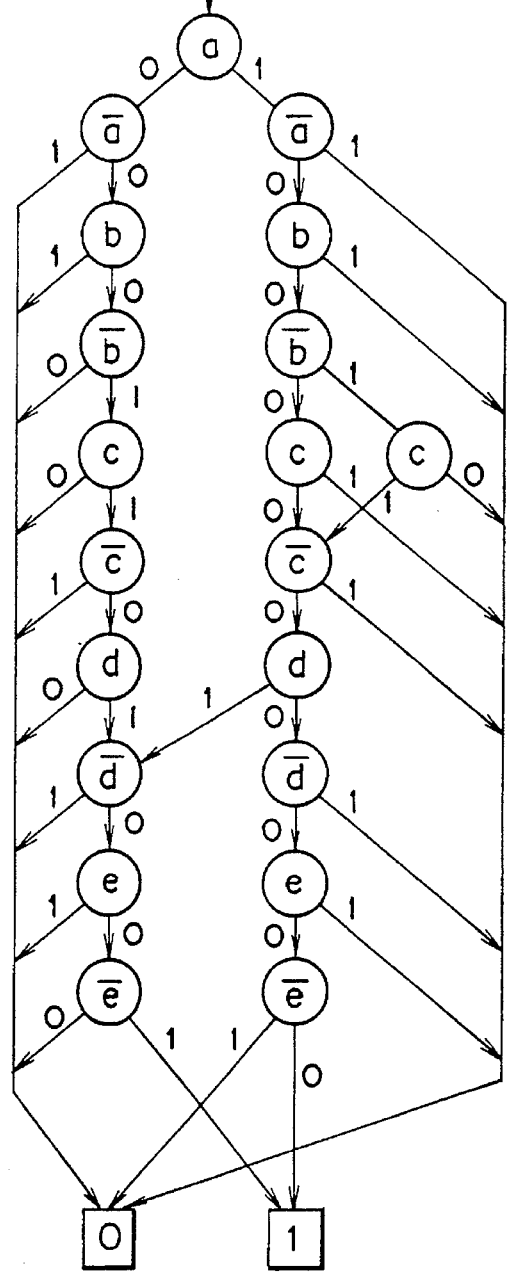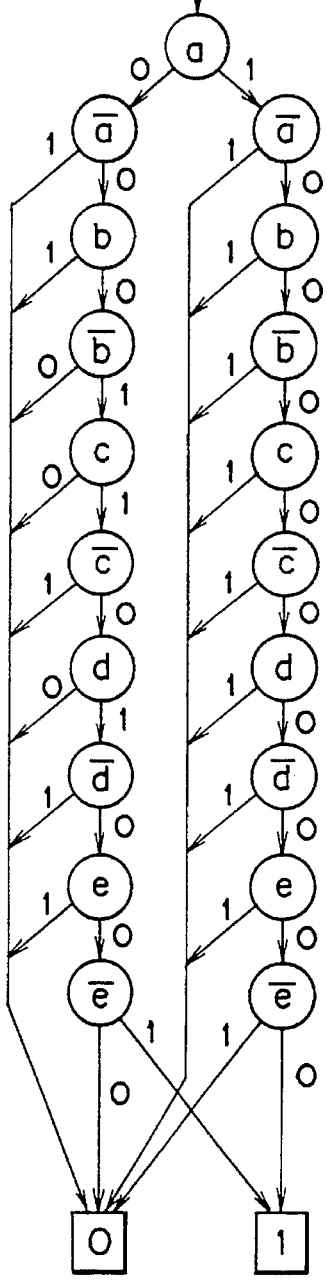
FIG. 21A
(PRIOR ART)
FIG. 21B
(PRIOR ART)

SYSTEM AND METHOD FOR PROCESSING LOGIC FUNCTION AND FAULT DIAGNOSIS USING BINARY TREE REPRESENTATION

BACKGROUND OF THE INVENTION

1. Field of the Invention

The present invention relates to a system and method for processing a logic function including a plurality of input variables, or an any subset of a set consisting of a plurality of elements, and particularly to a design system and method of a logic circuit which represents a logic function or a subset by using binary decision diagrams including nodes and edges, and simplifies the logic function on the basis of the binary decision diagrams.

2. Description of Related Art

A method referred to as a binary decision diagram is used as one of the methods for representing logic functions (see, R. E. Bryant, "Graph-Based Algorithms for Boolean Function Manipulation", IEEE Trans Comput Vol C-35, No 8, pp. 677–691). This representing method includes the following processings.

(1) Ordering

This processing provides all input variables of a logic function with a fixed order. For example, in FIG. 1, a fixed order $x3, x2, x1$ is given to the three input variables.

(2) Expanding

This processing derives two subsets from the logic function by substituting logic values 0 and 1 into one of the input variables. For example, two subsets are derived by substituting 0 and 1 into the input variable $x3$.

(3) Generation of a Binary Tree Graph

The expanding is iterated for all input variables according to the sequence given by the ordering, in order to generate a binary tree graph as shown in FIG. 1. In FIG. 1, a circle represents an intermediate node, and a square represents a terminal node. An intermediate node corresponds to each individual expanding, and has two edges pointing two subsets obtained by the expanding. A terminal node, on the other hand, represents a logic value of 0 or 1 obtained as a result of a series of expandings.

(4) Node Sharing

This processing reduces a first intermediate node 11 and a second intermediate node 12 into a single intermediate node 15 as shown in (b) of FIG. 2, when the 0-edges from the first and second intermediate nodes 11 and 12 point an identical intermediate node 13, and the 1-edges from the first and second intermediate nodes 11 and 12 point another identical intermediate node 14 as shown in (a) of FIG. 2.

(5) Node Elimination

This process eliminates a first intermediate node 17, and connects an edge pointing the first intermediate node 17 to a second intermediate node 18 as shown in (b) of FIG. 3, if both 0- and 1-edges from the first intermediate node 17 points the identical intermediate node 18 as shown in (a) of FIG. 3.

The node sharing and elimination will reduce the binary tree graph shown in FIG. 1 to a binary decision diagram as shown in FIG. 4.

Thus, binary decision diagrams can represent a logic function. Besides, binary decision diagrams can be used to represent set data.

FIG. 5 illustrates a method for representing set data by means of a binary decision diagram. In this figure, eight elements a, b, c, d, e, f, g and h of a set are associated with numbers 0, 1, 2, 3, 4, 5, 6 and 7, respectively, and the numbers are represented by three digit binary numbers. If two elements b and c of the set data are given as initial data 22, the elements b and c are encoded in accordance with a number table 21, thereby producing encoded data 23 represented by the three digit binary numbers. Representing individual digits of the binary numbers from left to right by $x3$, $x2$ and $x1$ will generate a binary tree graph 24 from the encoded data 23.

In the binary tree graph 24, only {001} and {010} associated with the elements b and c reach 1-terminal nodes, and the edges associated with the other elements reach 0-terminal nodes. This means that the elements b and c are included in a subset of the set consisting of eight elements. The binary tree graph 24 is subjected to the node sharing and the node elimination so that a binary decision diagram 25 is generated.

Thus, a set can be associated with a logic function by representing individual elements of the set by different integers, representing the integers by binary numbers, and considering 0 and 1 of individual digits of the binary numbers as logic values. Furthermore, the set can be simplified by the node sharing and the node elimination, which are described above, while carrying out the generation of a binary tree graph. In this case, the processing that obtains two subgraphs by substituting 0 and 1 into the input variable of each intermediate node of a binary tree graph means, when the processing is viewed as the processing of set data, that all the elements of the set data is divided into two subsets in accordance with 0 or 1 of a particular digit of the binary number representing an element.

Using the binary decision diagram technique described above makes it possible to share and eliminate intermediate nodes. Accordingly, the binary decision diagrams, when applied to an automatic design or the like using computers, can achieve simplification of logic circuits, and represent data with a small memory capacity. In addition, computing time can be saved by the reduction in the memory capacity.

In such processings, however, a processing often occurs that must handle subsets including much smaller number of elements than the entire set. In such a case, if low element numbers represented in the binary notation are assigned to elements having higher appearance frequency, the appearance frequency of 0 at individual digits of the binary numbers will become much greater than that of 1. This presents a problem in that the possibility reduces that the destinations of the two edges from an intermediate node agree with each other, and hence, the number of nodes to be eliminated decreases, and the memory capacity increases.

In addition, the method employing the conventional binary decision diagrams presents another problem in that the number of elements of the entire set must be fixed in advance. This is because even if two set data represent the same set, their graphic representations may differ depending on the number of digits of the binary numbers representing the elements of the set data as shown in FIGS. 6A and 6B (FIG. 6A illustrates a graph of three digit data, whereas FIG. 6B illustrates a graph of four digit data).

SUMMARY OF THE INVENTION

It is therefore an object of the present invention to provide a design system and method for a logic circuit that can reduce the memory capacity and computing time by representing a subset (sparse set) whose number of elements is substantially smaller than that of the entire set using a graph including a small number of nodes.

According to a first aspect of the present invention, there is provided a logic function data processing system comprising:

an ordering table providing a fixed order to a plurality of input variables x constituting logic function data;

a node table for storing a binary tree graph consisting of a plurality of intermediate nodes and two types of terminal nodes t0 and t1 representing logic values 0 and 1, respectively, the node table being provided with areas, each of which stores one of the input variables x associated with each one of the intermediate nodes, and two edges e0 and e1 representing destinations obtained by substituting 0 and 1 into the input variable x, respectively;

means for performing an expanding processing that substitutes 0 and 1 into a first input variable x1 recorded in the ordering table to obtain first two subfunctions of the logic function, for performing an expanding processing that substitutes 0 and 1 into a second input variable x2 recorded in the ordering table to obtain second two subfunctions for each of the first two subfunctions, for iterating a similar expanding processing on all the remaining input variables in accordance with the order recorded in the ordering table, for generating the binary tree graph by representing expanded results, which are obtained by the expanding processings, by the intermediate nodes and terminal nodes t0 and t1, and for storing the intermediate nodes and terminal nodes t0 and t1 constituting the binary tree graph into the node table;

means for testing, during the expanding processing and before generating a new intermediate node a and storing it into the node table, whether a node b, which is equivalent to the node a in the sense that the node b has the same input variable x and the same edges e0 and e1 as the node a, is already present in the node table, and for performing sharing, if the equivalent node b is already present in the node table, the nodes a and b by not generating the new node a, and by making an edge pointing the node a point the node b; and means for performing, during the expanding processing and if the edge e1 of a new intermediate node a directly points a terminal node t0, node reduction by not generating the intermediate node a, and by making an edge pointing the intermediate node a point a destination of the other edge e0 of the intermediate node a.

Here, the logic function data processing system may further comprise a number table that associates subset data with the logic function data, the subset data including given elements of set data consisting of a plurality of elements, the number table including the elements of the set data and different integers equal to or greater than zero which are assigned to each one of the elements, and each of the input variables x being associated with each one of digit positions of a binary number representing each of the integers.

The logic function data may take a value 1 when the element, which is associated with the integer number represented in the form of the binary number constituted by the input variables x, belongs to the subset data, and otherwise may take a value 0.

According to a second aspect of the present invention, there is provided a design system of a logic circuit for designing a logic circuit on the basis of a logic function representing an on-set of the logic circuit, which is represented in the form of a sum of cubes, by representing the cubes by different binary numbers whose number of digits is equal to the total number of literals constituting the cubes, values 1 and 0 of each digit position of the binary numbers being associated with the presence and absence of each one of the literals, the design system comprising:

a number table representing correspondence between the cubes and the binary numbers;

an ordering table providing a fixed order to each one of the literals;

a node table for storing a binary tree graph consisting of a plurality of intermediate nodes and two types of terminal nodes t0 and t1 representing logic values 0 and 1, respectively, the node table being provided with areas, each of which stores one of the literals associated with each one of the intermediate nodes, and two edges e0 and e1 representing destinations obtained by substituting 0 and 1 into the literal, respectively;

means for performing an expanding processing that substitutes 0 and 1 into a first literal recorded in the ordering table to obtain first two subfunctions of the logic function, for performing an expanding processing that substitutes 0 and 1 into a second literal recorded in the ordering table to obtain second two subfunctions for each of the first two subfunctions, for iterating a similar expanding processing on all the remaining literals in accordance with the order recorded in the ordering table, for generating the binary tree graph by representing expanded results, which are obtained by the expanding processings, by the intermediate nodes and terminal nodes t0 and t1, and for storing the intermediate nodes and terminal nodes t0 and t1 constituting the binary tree graph into the node, table;

means for testing, during the expanding processing and before generating a new intermediate node a and storing it into the node table, whether a node b, which is equivalent to the node a in the sense that the node b has the same literal and the same edges e0 and e1 as the node a, is already present in the node table, and for performing sharing, if the equivalent node b is already present in the node table, the nodes a and b by not generating the new node a, and by making an edge pointing the node a point the node b; and means for performing, during the expanding processing and if the edge e1 of a new intermediate node a directly points a terminal node t0, node reduction by not generating the intermediate node a, and by making an edge pointing the intermediate node a point a destination of the other edge e0 of the intermediate node a.

Here, the design system of a logic circuit may further comprise:

means for connecting input terminals of the logic circuit to input terminals of AND elements on a circuit diagram corresponding to the logic circuit in accordance with the literals included in the cubes obtained by the sharing and the node reduction; and means for connecting each of outputs of the AND gates to an OR gate on the circuit diagram.

The design system of a logic circuit may further comprise means for generating a circuit using NAND elements and NOR elements, which is equivalent to the circuit represented by the circuit diagram, by performing equivalent replacement on the circuit after generating the circuit combining the AND elements and OR elements.

According to a third aspect of the present invention, there is provided a fault diagnosis system for obtaining a set of faults of a logic circuit when a plurality of faults are assumed to take place in the logic circuit, each of the faults fixing a signal on a signal line of the logic circuit at 0 or 1, and having influence on an output signal of the logic circuit, the set of faults, which makes a signal value on a signal line different from a normal value on the signal line, being sequentially calculated from an input terminal to an output terminal of the logic circuit by using set operations in accordance with the logic of the logic circuit, the fault diagnosis system comprising:

means for associating values 1 and 0 of each digit position of binary numbers, whose number of digits equal to the total number of faults assumed to take place, with the presence and absence of each one of the faults, thereby representing the set of faults by a logic function;

an ordering table providing a fixed order to each one of the faults;

a node table for storing a binary tree graph consisting of a plurality of intermediate nodes and two types of terminal nodes t0 and t1 representing logic values 0 and 1, respectively, the node table being provided with areas, each of which stores one of the faults associated with each one of the intermediate nodes, and two edges e0 and e1 representing destinations obtained by substituting 0 and 1 into a fault, respectively;

means for performing an expanding processing that substitutes 0 and 1 into a first fault recorded in the ordering table to obtain first two subfunctions of the logic function, for performing an expanding processing that substitutes 0 and 1 into a second fault recorded in the ordering table to obtain second two subfunctions for each of the first two subfunctions, for iterating a similar expanding processing on all the remaining faults in accordance with the order recorded in the ordering table, for generating the binary tree graph by representing expanded results, which are obtained by the expanding processings, by the intermediate nodes and terminal nodes t0 and t1, and for storing the intermediate nodes and terminal nodes t0 and t1 constituting the binary tree graph into the node table;

means for testing, during the expanding processing and before generating a new intermediate node a and storing it into the node table, whether a node b, which is equivalent to the node a in the sense that the node b has the same fault and the same edges e0 and e1 as the node a, is already present in the node table, and for performing sharing, if the equivalent node b is already present in the node table, the nodes a and b by not generating the new node a, and by making an edge pointing the node a point the node b; and means for performing, during the expanding processing and if the edge e1 of a new intermediate node a directly points a terminal node t0, node reduction by not generating the intermediate node a, and by making an edge pointing the node a point a destination of the other edge e0 of the intermediate node a.

According to a fourth aspect of the present. invention, there is provided a logic function data processing method having an ordering table providing a fixed order to a plurality of input variables x constituting logic function data, and a node table for storing a binary tree graph consisting of a plurality of intermediate nodes and two types of terminal nodes t0 and t1 representing logic values 0 and 1, respectively, the node table being provided with areas, each of which stores one of the input variables x associated with each one of the intermediate nodes, and two edges e0 and e1 representing destinations obtained by substituting 0 and 1 into the input variable x, respectively, the method comprising the steps of:

performing an expanding processing that substitutes 0 and 1 into a first input variable x1 recorded in the ordering table to obtain first two subfunctions of the logic function;

performing an expanding processing that substitutes 0 and 1 into a second input variable x2 recorded in the ordering table to obtain second two subfunctions for each of the first two subfunctions;

iterating a similar expanding processing on all the remaining input variables in accordance with the order recorded in the ordering table;

generating the binary tree graph by representing expanded results, which are obtained by the expanding processings, by the intermediate nodes and terminal nodes t0 and t1;

storing the intermediate nodes and terminal nodes t0 and t1 constituting the binary tree graph into the node table;

testing, during the expanding processing and before generating a new intermediate node a and storing it into the node table, whether a node b, which is equivalent to the node a in the sense that the node b has the same input variable x and the same edges e0 and e1 as the node a, is already present in the node table;

performing sharing, if the equivalent node b is already present in the node table, the nodes a and b by not generating the new node a, and by making an edge pointing the node a point the node b; and performing, during the expanding processing and if the edge e1 of a new intermediate node a directly points a terminal node t0, node reduction by not generating the intermediate node a, and by making an edge pointing the intermediate node a point a destination of the other edge e0 of the intermediate node a.

The logic function data processing method may further comprise a number table that associates subset data with the logic function data, the subset data including given elements of set data consisting of a plurality of elements, the number table including the elements of the set data and different integers equal to or greater than zero which are assigned to each one of the elements, and each of the input variables x being associated with each one of digit positions of a binary number representing each of the integers.

The logic function data may take a value 1 when the element, which is associated with the integer number represented in the form of the binary number constituted by the input variables x, belongs to the subset data, and otherwise may take a value 0.

According to a fifth aspect of the present invention, there is provided a design method of a logic circuit for designing a logic circuit on the basis of a logic function representing an on-set of the logic circuit, which is represented in the form of a sum of cubes, by representing the cubes by different binary numbers whose number of digits is equal to the total number of literals constituting the cubes, values 1 and 0 of each digit position of the binary numbers being associated with the presence and absence of each one of the literals, the design method having a number table representing correspondence between the cubes and the binary numbers, an ordering table providing a fixed order to each one of the literals, and a node table for storing a binary tree graph consisting of a plurality of intermediate nodes and two types of terminal nodes t0 and t1 representing logic values 0 and 1, respectively, the node table being provided with areas, each of which stores one of the literals associated with each one of the intermediate nodes, and two edges e0 and e1 representing destinations obtained by substituting 0 and 1 into the literal, respectively, the design method comprising the steps of:

performing an expanding processing that substitutes 0 and 1 into a first literal recorded in the ordering table to obtain first two subfunctions of the logic function;

performing an expanding processing that substitutes 0 and 1 into a second literal recorded in the ordering table to obtain second two subfunctions for each of the first two subfunctions;

iterating a similar expanding processing on all the remaining literals in accordance with the order recorded in the ordering table;

generating the binary tree graph by representing expanded results, which are obtained by the expanding processings, by the intermediate nodes and terminal nodes t0 and t1;

storing the intermediate nodes and terminal nodes t0 and t1 constituting the binary tree graph into the node table;

testing, during the expanding processing and before generating a new intermediate node a and storing it into the node table, whether a node b, which is equivalent to the node a in the sense that the node b has the same literal and the same edges e0 and e1 as the node a, is already present in the node table;

performing sharing, if the equivalent node b is already present in the node table, the nodes a and b by not generating the new node a, and by making an edge pointing the node a point the node b; and performing, during the expanding processing and if the edge e1 of a new intermediate node a directly points a terminal node t0, node reduction by not generating the intermediate node a, and by making an edge pointing the intermediate node a point a destination of the other edge e0 of the intermediate node a.

Here, the design method of a logic circuit may further comprise the steps of:

connecting input terminals of the logic circuit to input terminals of AND elements on a circuit diagram corresponding to the logic circuit in accordance with the literals included in the cubes obtained by the sharing and the node reduction; and connecting each of outputs of the AND gates to an OR gates on the circuit diagram.

The design method of a logic circuit may further comprise the step of generating a circuit using NAND elements and NOR elements, which is equivalent to the circuit represented by the circuit diagram, by performing equivalent replacement on the circuit after generating the circuit combining the AND elements and OR elements.

According to a sixth aspect of the present invention, there is provided a fault diagnosis method for obtaining a set of faults of a logic circuit when a plurality of faults are assumed to take place in the logic circuit, each of the faults fixing a signal on a signal line of the logic circuit at 0 or 1, and having influence on an output signal of the logic circuit, the set of faults, which makes a signal value on a signal line different from a normal value on the signal line, being sequentially calculated from an input terminal to an output terminal of the logic circuit by using set operations in accordance with the logic of the logic circuit, the method having an ordering table providing a fixed order to each one of the faults, and a node table for storing a binary tree graph consisting of a plurality of intermediate nodes and two types of terminal nodes t0 and t1 representing logic values 0 and 1, respectively, the node table being provided with areas, each of which stores one of the faults associated with each one of the intermediate nodes, and two edges e0 and e1 representing destinations obtained by substituting 0 and 1 into a fault, respectively, the fault diagnosis method comprising the step of:

associating values 1 and 0 of each digit position of binary numbers, whose number of digits equal to the total number of faults assumed to take place, with the presence and absence of each one of the faults, thereby representing the set of faults by a logic function;

performing an expanding processing that substitutes 0 and 1 into a first fault recorded in the ordering table to obtain first two subfunctions of the logic function;

performing an expanding processing that substitutes 0 and 1 into a second fault recorded in the ordering table to obtain second two subfunctions for each of the first two subfunctions;

iterating a similar expanding processing on all the remaining faults in accordance with the order recorded in the ordering table, for generating the binary tree graph by representing expanded results, which are obtained by the expanding processings, by the intermediate nodes and terminal nodes t0 and t1;

storing the intermediate nodes and terminal nodes t0 and t1 constituting the binary tree graph into the node table;

testing, during the expanding processing and before generating a new intermediate node a and storing it into the node table, whether a node b, which is equivalent to the node a in the sense that the node b has the same fault and the same edges e0 and e1 as the node a, is already present in the node table;

performing sharing, if the equivalent node b is already present in the node table, the nodes a and b by not generating the new node a, and by making an edge pointing the node a point the node b; and performing, during the expanding processing and if the edge e1 of a new intermediate node a directly points a terminal node t0, node reduction by not generating the intermediate node a, and by making an edge pointing the intermediate node a point a destination of the other edge e0 of the intermediate node a.

The present invention reduces the number of nodes by using a 0-suppressed binary decision diagram technique (referred to as "0-suppress method" for the purpose of simplification hereinafter). The 0-suppress method is one of the node elimination methods, and can be expressed as follows: Let us assume that edges representing substitution of 0 and 1 into the input variable of an intermediate node are e0 and e1, respectively. Then, the rule of the 0-suppress method can be stated as follows: If the edge e1 points a 0-terminal node, eliminate the intermediate node, the edge e1, and the 0-terminal node, and then connect the edge pointing this intermediate node to the edge e0.

According to the present invention, a set (sparse set) having a considerably smaller number of elements than the entire set can be represented by a graph including smaller number of nodes than a conventional graph. As a results, the present invention can achieve automatic design of a larger scale logic circuit than a conventional method. In addition, reduction in processing data, improvement in processing speed, and saving of design time can be achieved.

BRIEF DESCRIPTION OF THE DRAWINGS

The above and other objects, effects, features and advantages of the present invention will become more apparent from the following description of the embodiments thereof taken in conjunction with the accompanying drawings.

FIG. 9 is a diagram illustrating processes simplifying the binary tree graph of FIG. 7 by using the 0-suppress node elimination in accordance with the present invention;

FIG. 13 shows an ordering table in the first embodiment;

FIGS. 14A–14C illustrate changes in the contents of a node table in the first embodiment;

FIG. 19 is a diagram illustrating a method for transforming a finally obtained sum-of-products form into a circuit diagram in the first embodiment;

FIGS. 21A and 21B show conventional binary decision diagrams representing the sum-of-products forms as shown in FIGS. 18A and 18B;

DETAILED DESCRIPTION OF PREFERRED EMBODIMENTS

The invention will now be described with reference to the accompanying drawings. Before describing the details of the present invention, however, the principle thereof will be described with reference to FIGS. 7–9.

Figure 3:
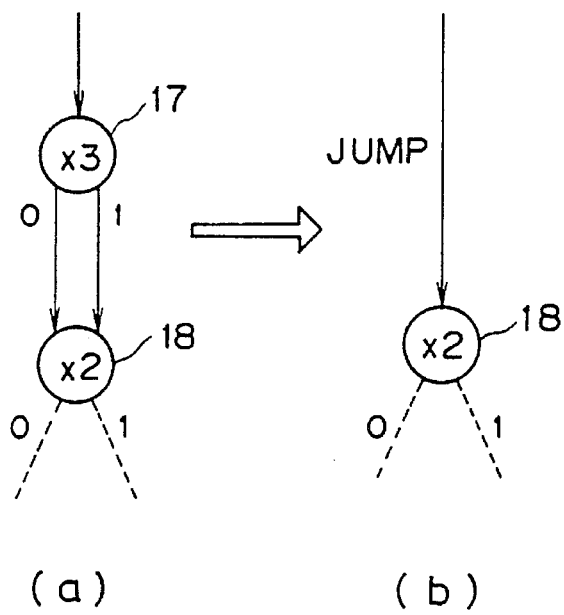
FIG. 3 is a diagram illustrating a conventional node elimination used in the process of generating a binary decision diagram.
Figure 4:
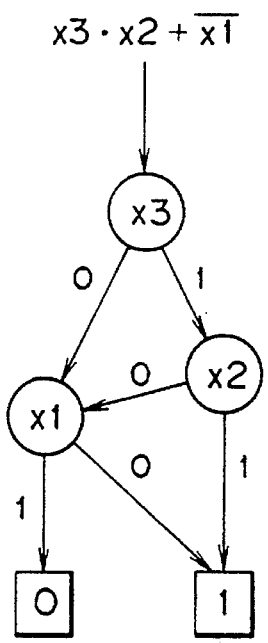
FIG. 4 is a diagram illustrating a conventional binary decision diagram generated by simplifying the binary tree graph of FIG. 1 using the conventional node sharing and node elimination.
Figure 5:
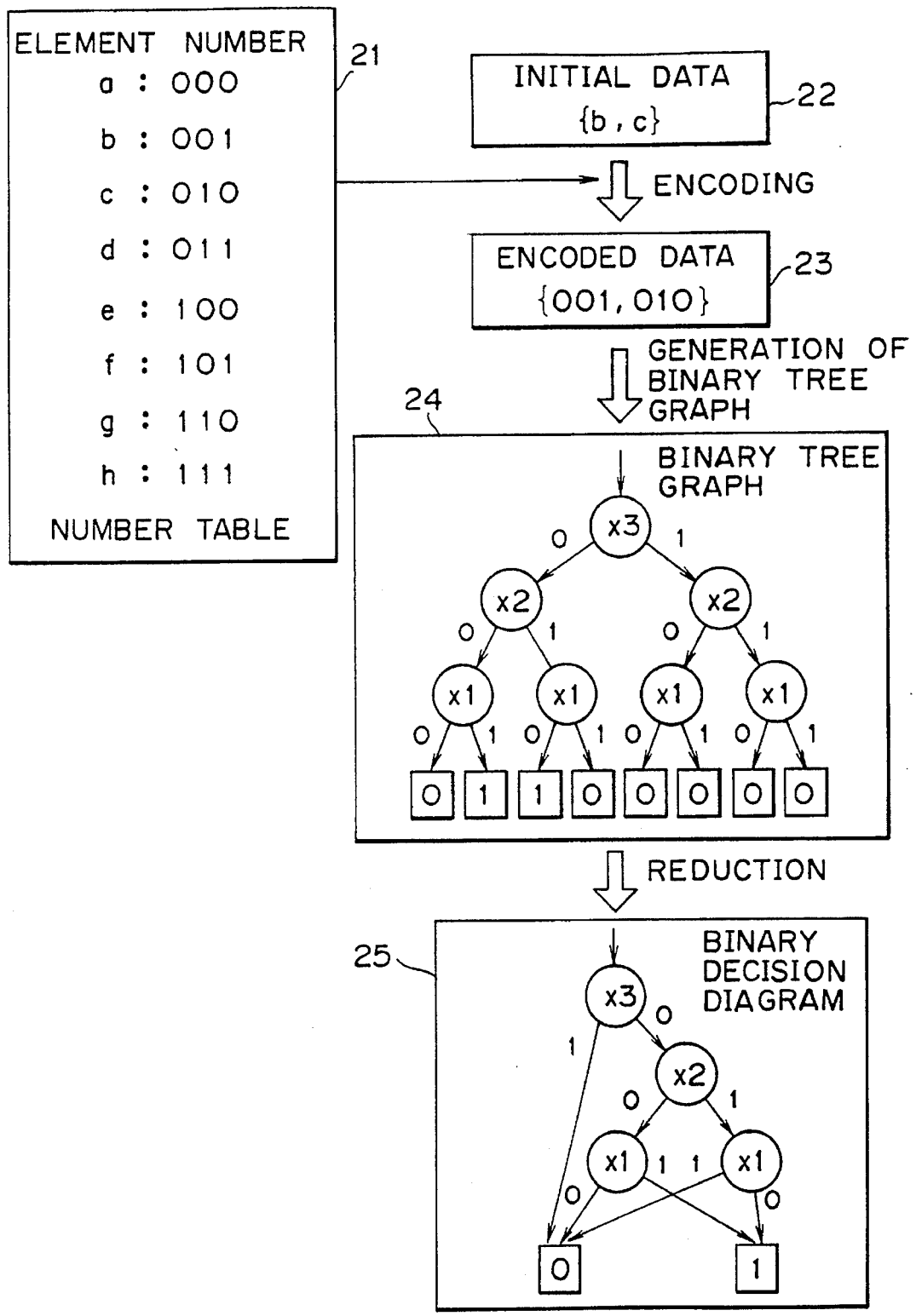
FIG. 5 is a block diagram illustrating a process for generating a conventional binary decision diagram representing a set data.
Figure 7:
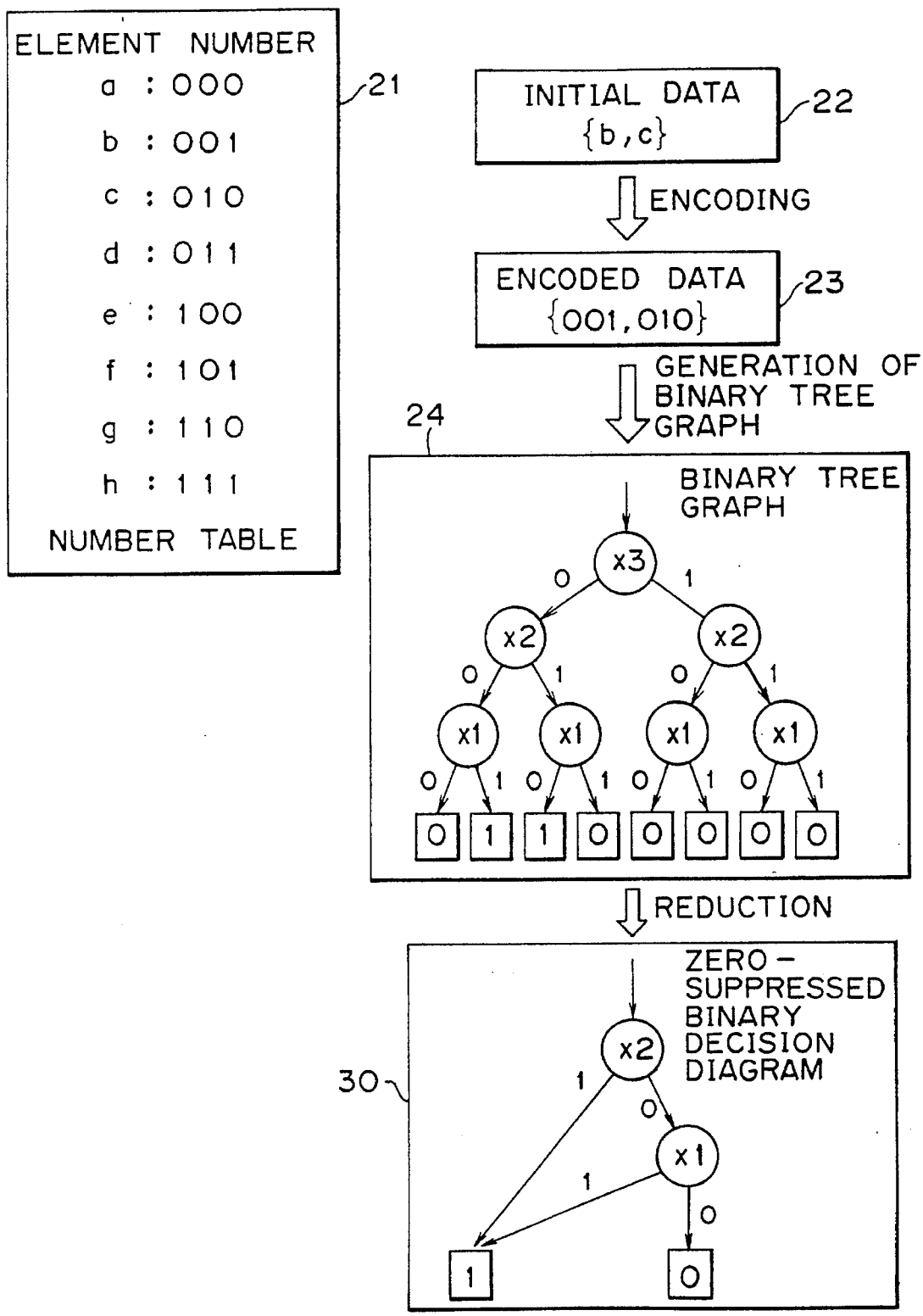
FIG. 7 is a block diagram showing the principle of generating a 0-suppressed binary decision diagram in accordance with the present invention.
Figure 8:
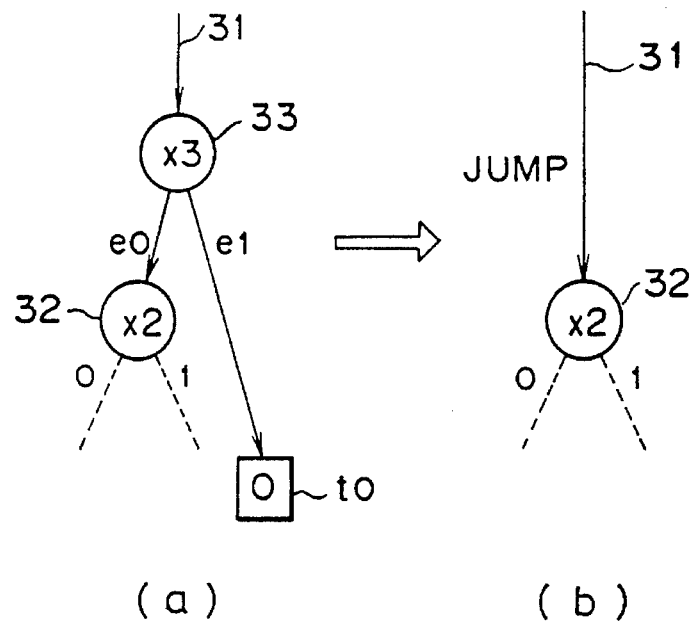
FIG. 8 is a diagram illustrating a 0-suppress node elimination in accordance with the present invention.
Figure 10:
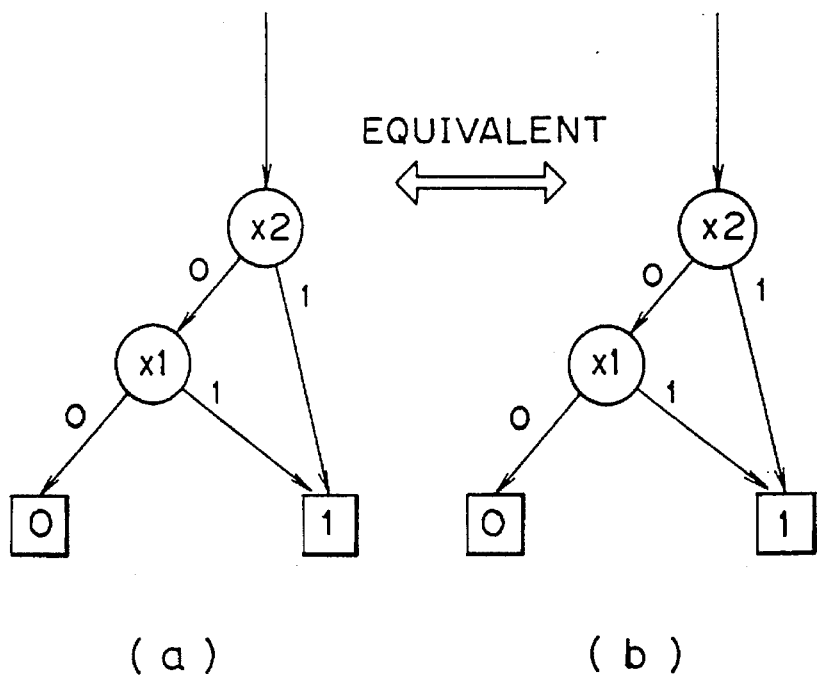
FIG. 10 is a diagram illustrating examples of 0-suppressed binary decision diagrams which take the same graphic pattern for the same set data represented by binary numbers of different digit numbers.

In FIG. 7, the steps as far as the generation of the binary tree graph 24 are identical to those of the conventional example of FIG. 5. The technique for generating a 0-suppressed binary decision diagram 30 from the binary tree graph 24 is the subject matter of the present invention. FIG. 8 illustrates a new node elimination in accordance with the present invention, which is used instead of the conventional node elimination as illustrated in FIG. 3. The new node elimination is carried out before an intermediate node is generated and stored into a node table described later.

In FIG. 8, the reference numeral 33 designates an intermediate node, e0 and e1 designate edges pointing destinations when the input variable is substituted by 0 and 1, respectively, and t0 denotes a 0-terminal node. The 0-suppress method in accordance with the present invention tests whether the edge e1 of the intermediate node 33 directly points the 0-terminal node t0, and if the edge e1 directly points the 0-terminal t0, the intermediate node 33 is not generated. Besides, an edge 31 pointing the intermediate node 33 is directly connected to a node 32 which is pointed by the other edge e0 of the intermediated node 33. Thus, the graph in (a) of FIG. 8 is reduced to the graph in (b) of FIG. 8.

FIG. 9 shows a series of processes as through which the binary tree graph 24 of FIG. 7 is simplified into the 0-suppressed binary decision diagram 30. The binary tree graph 24 in (a) of FIG. 9 is reduced as shown in (b) of FIG. 9 by sharing terminal nodes. Then, it is further reduced as shown in (c) of FIG. 9 by eliminating the intermediate nodes B, C and D using the node elimination as shown in FIG. 8. These nodes B, C and D are removed because their 1-edges directly point the 0-terminal node. Iterating the node elimination according to the 0-suppress method will further eliminate the intermediate node F whose 1-edge directly points the 0-terminal node, as shown in (c) and (d) of FIG. 9. Finally, the intermediate node G is eliminated, and the 0-suppressed binary decision diagram 30 is obtained as the result of the simplification.

Figure 1:
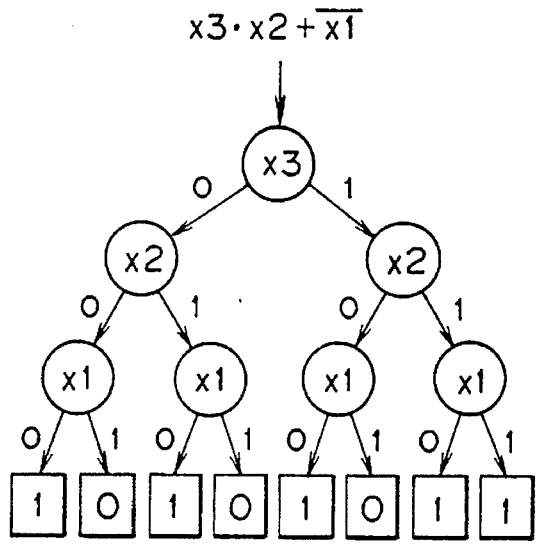
FIG. 1 is a diagram illustrating a binary tree graph obtained by expanding a logic function.
Figure 2:
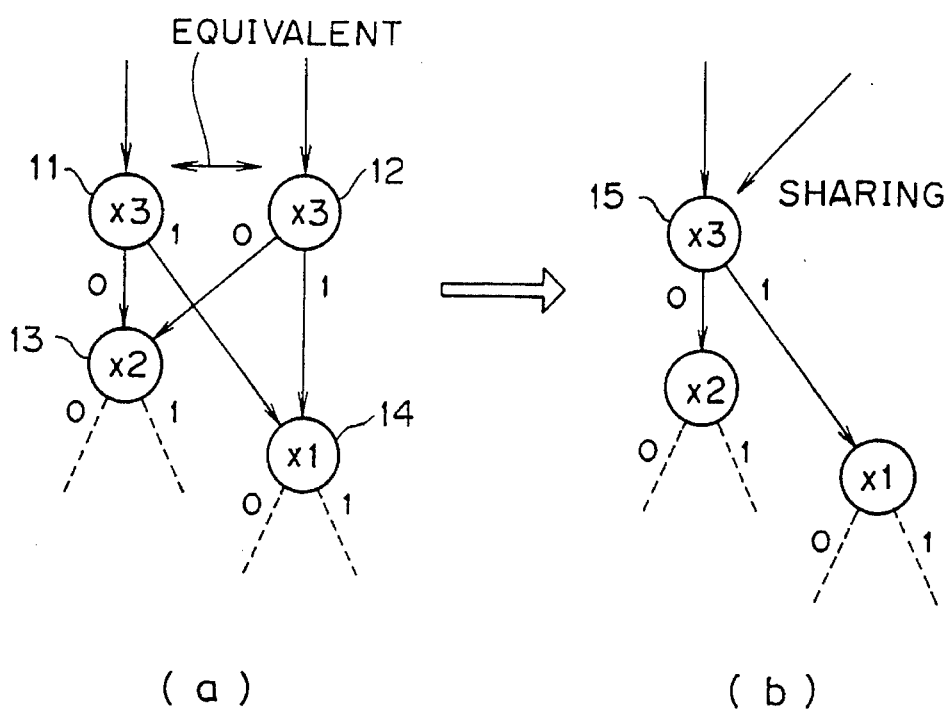
FIG. 2 is a diagram illustrating a conventional node sharing used in the process of generating a binary decision diagram.

It is found that the 0-suppressed binary decision diagram 30 has one to one correspondence with the conventional binary decision diagram 25 in FIG. 5 as follows: First, inversely applying the reduction rules of FIGS. 2 and 3 to a conventional binary decision diagram will result in its original binary tree graph. Likewise, inversely applying the rules of FIGS. 2 and 8 to a 0-suppressed binary decision diagram will result in its original binary tree graph. Accordingly, it is found the 0-suppressed binary decision diagram has the same information as the conventional binary decision diagram.

Figures 6A, 6B:
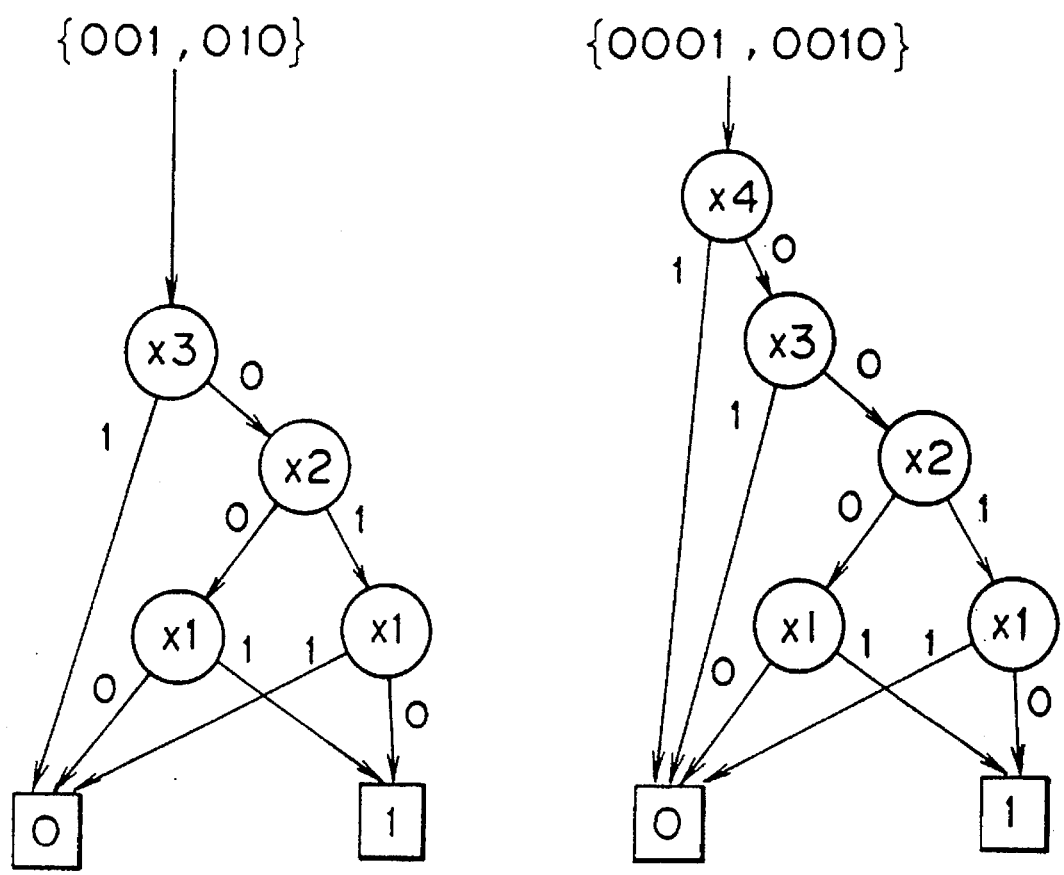
FIGS. 6A and 6B are diagrams illustrating examples of binary decision diagrams which take different graphic patterns for the same set data represented by binary numbers of different digit numbers.

Applying the node elimination of the 0-suppress method in accordance with the present invention to the binary decision diagram as shown in FIG. 6B will eliminate the intermediate node x4, thereby resulting in the binary decision diagram as shown in FIG. 6A. In other words, even if the number of digits of binary numbers associated with elements are different, the graphic patterns become identical as long as the elements are identical. As a result, it is not necessary to fix the number of elements of an entire set or the number of digits of the binary numbers. Accordingly, they can be changed during processings, which allows flexible processing.

Furthermore, when handling set data of sum-of-products forms, in which appearance frequency of 0 in each digit position of element numbers is much greater than that of 1, as in the simplification of logic circuits, the probability that the edge e1 from each intermediate node points a 0-terminal node t0 will be large. Therefore, in such a case, the new node elimination in accordance with the present invention can be applied to a larger number of nodes, and hence, it can eliminate a greater number of nodes than the conventional node elimination.

Figure 11:
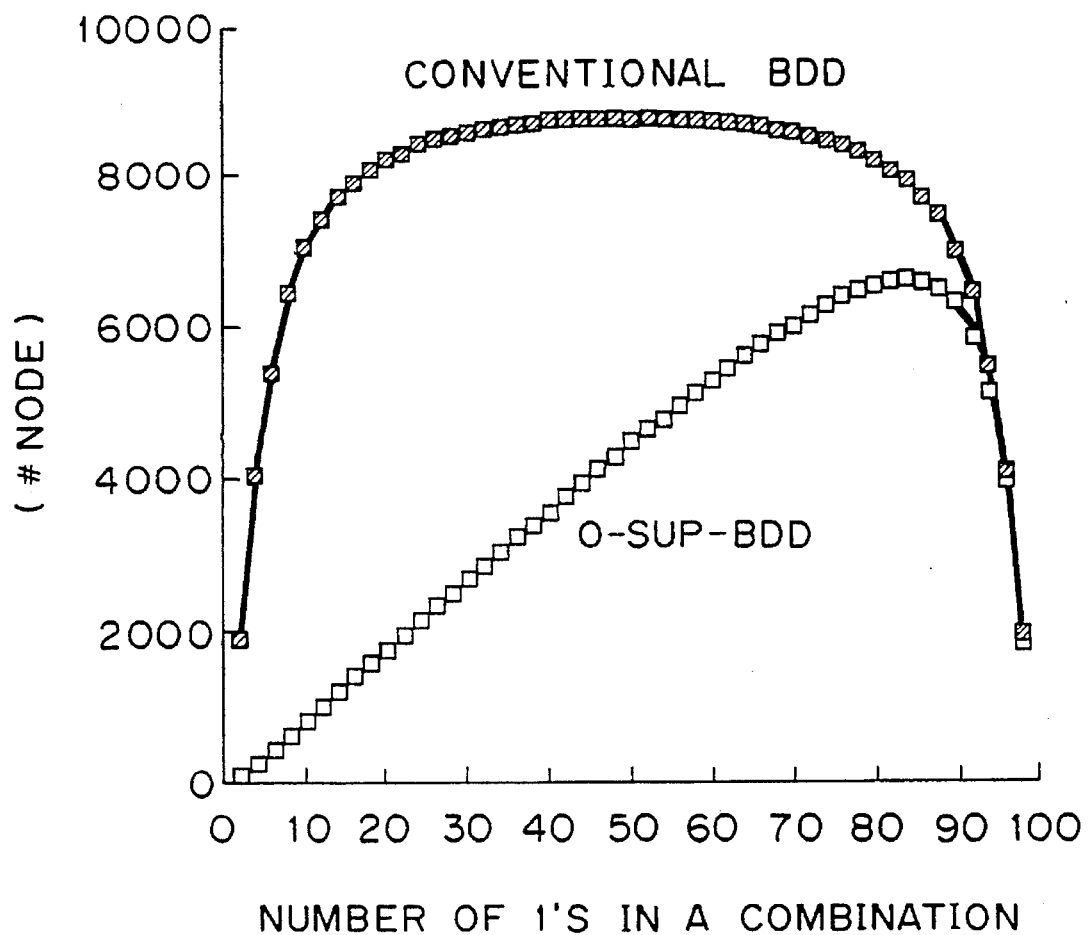
FIG. 11 is a graph comparing the number of nodes in the 0-suppressed binary decision diagram in accordance with the present invention, and the number of nodes in the conventional binary decision diagram.

FIG. 11 is a graph showing a result of a statistical experiment conducted to evaluate efficiency of the 0-suppress node elimination in accordance with the present invention. A set of one hundred combinations was generated each of which selects k out of 100 objects randomly. Then, the numbers of nodes of both 0-suppressed binary decision diagrams and conventional binary decision diagrams representing these random combinations are compared. The result for variation in k from 1 to 99 is shown in FIG. 11. The number of nodes is averaged over 100 experiments. The result shows that the 0-suppressed binary decision diagrams are much more compact than the conventional binary decision diagrams, especially when k is small. Namely, 0-suppressed binary decision diagrams are remarkably effective for representing a set of sparse combinations. Although the effect weakens for large k, complement combinations can be used to reduce k when k exceed 50. For example, the combination selecting 90 out of 100 objects is equivalent to selecting the remaining 10 out of 100.

Using the conventional node elimination as shown in FIG. 3 together with the 0-suppress node elimination in accordance with the present invention as shown in FIG. 8 will result in the same graphic pattern as shown in (b) of FIGS. 3 and 8, starting from the different graphic patterns as shown in (a) of FIGS. 3 and 8. In other words, the uniqueness of the graph cannot be maintained in this case. To prevent this problem, the present invention does not use the conventional node elimination as shown in FIG. 3.

The 0-suppress method in accordance with the present invention can be applied to a design system of a logic circuit, a fault diagnosis system, or a set data processing unit. Embodiments thereof will be described below.

EMBODIMENT 1

Figure 12:
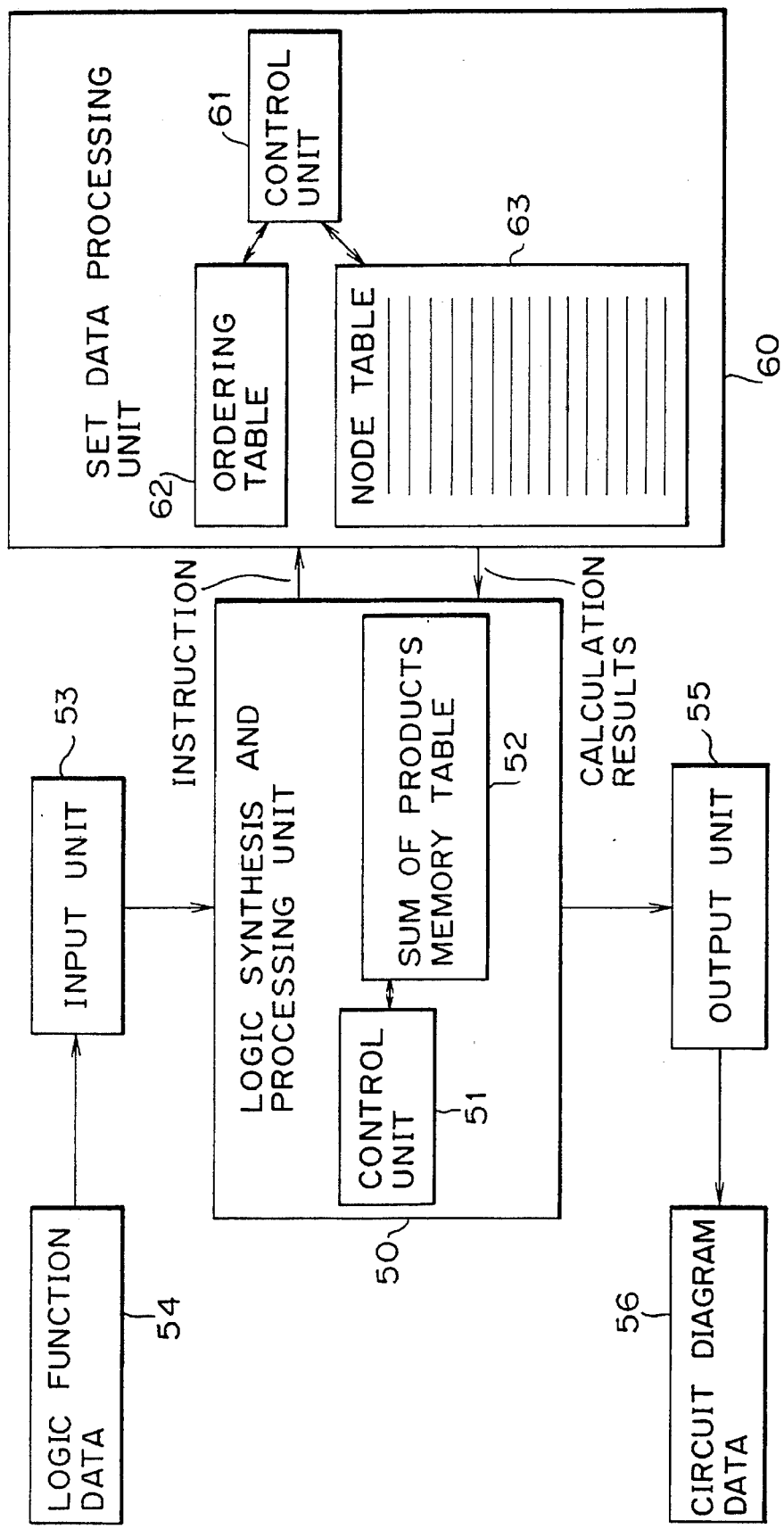
FIG. 12 is a block diagram showing a first embodiment of a design system of a logic circuit in accordance with the present invention.

FIG. 12 is a block diagram showing a first embodiment, wherein the 0-suppress method in accordance with the present invention is applied to a design system of a logic circuit.

In FIG. 12, the reference numeral 50 designates a logic synthesis and processing unit, 60 denotes a set data processing unit. The logic synthesis and processing unit 50 comprises a control unit 51 and a sum-of-products memory table 52. The control unit 51 stores logical expression data 54 inputted though an input unit 53, and issues commands to the set data processing unit 60. The logical expression data 54 are given, for example, in the form of logical expression data 54a. The sum-of-products memory table 52 is a table for recording a start address of individual cubes and sum-of-products form in a node table described above. Each of the cubes is a combination of positive or negative literals for input variables.

The set data processing unit 60 executes commands from the logic synthesis and processing. unit 50, and returns calculation results to the logic synthesis and processing unit 50. The logic synthesis and processing unit 50 stores the calculation results into the sum-of-products memory table 52. The control unit 51 arranges a circuit based on the calculation results. The circuit is outputted from an output unit 55 as a circuit diagram 56. The circuit diagram is given, for example, in the form of a circuit diagram 56a shown in FIG. 16.

The set data processing unit 60 comprises a control unit 61, an ordering table 62, and a node table 63. The ordering table 62 gives a fixed sequence to literals that represent characters and their complements of input variables, as shown in FIG. 13. The node table 63 stores, for each node (that is, an intermediate node or a terminal node), the literal associated with the node, and two nodes that the edges e0 and e1 from that node point, as shown in FIGS. 14A–14C. For example, FIGS. 14A–14C show the contents of the node table 63 corresponding to the 0-suppressed binary decision diagrams shown in FIGS. 17A–17C.

Next, the design processing of a logic circuit in accordance with the present embodiment will be described referring to FIGS. 12–19.

Figure 16:
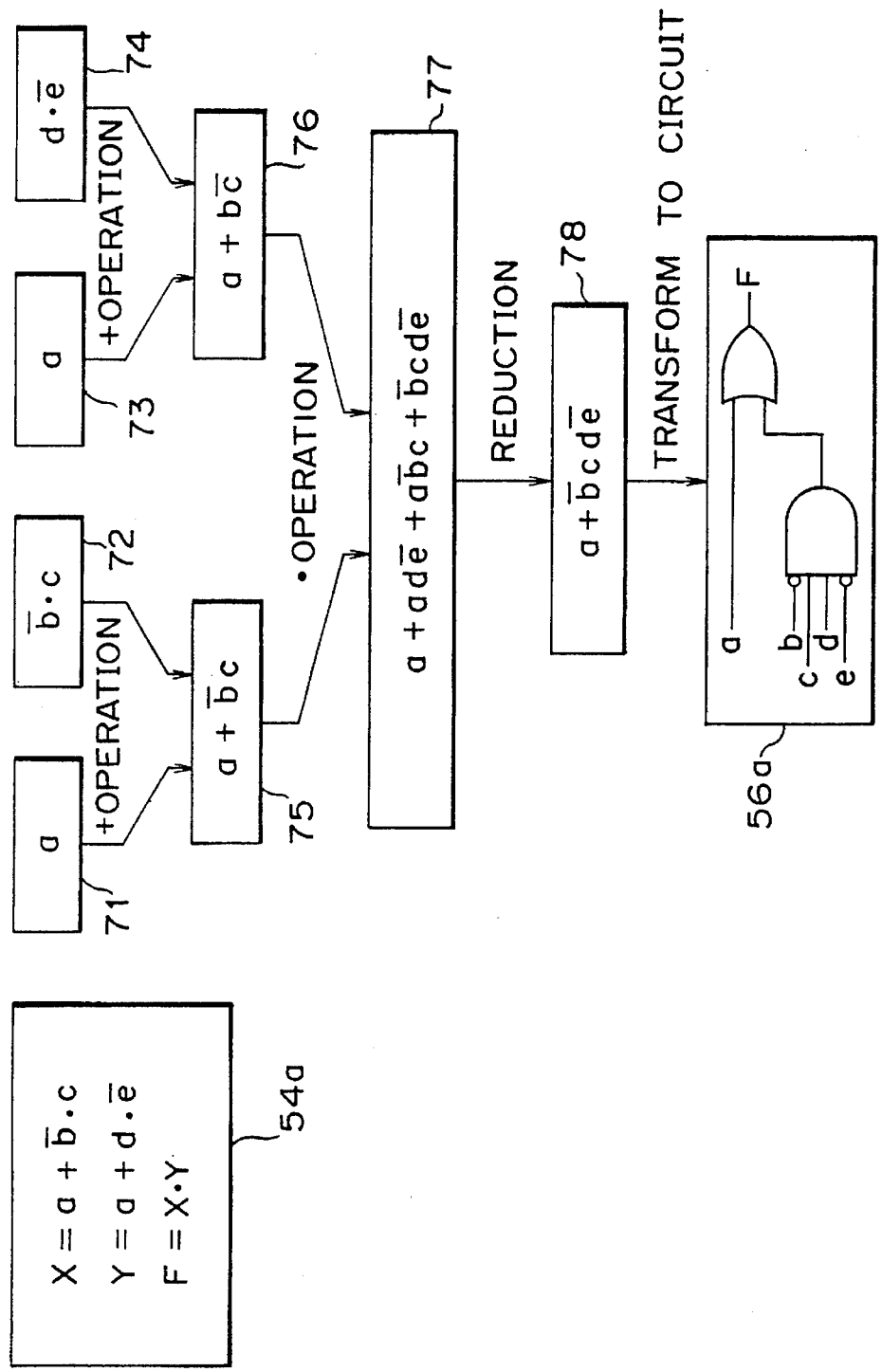
FIG. 16 is a block diagram illustrating an outline of simplification of a logic circuit in the first embodiment.

First, specifications for the logic circuit, which are described as a combination of logical expressions including logic operations such as ANDs and ORs as the logical expressions 54a of FIG. 16, are provided as an input file. The logical expressions are expanded to a two-level sum-of-products form, that is, a sum of a plurality of cubes.

Figure 15:
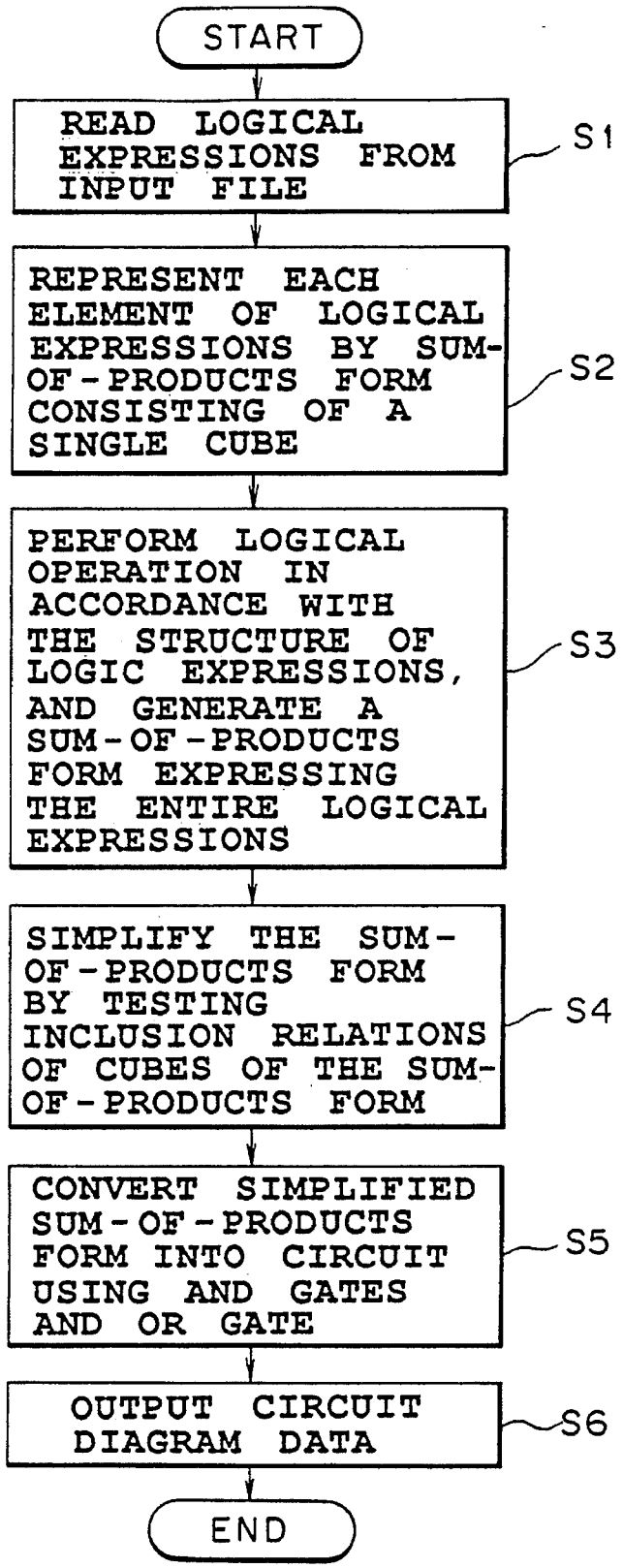
FIG. 15 is a flowchart for explaining the operation of the first embodiment.

The two-level sum-of-products form can be handled as set data of cubes. The logical expressions can be transformed into a two-level sum-of-products form as follows: First, individual terms appearing in the logical expressions are separated as set data, each of which consists of a single cube. Next, an operation between the plurality of cubes is iterated in accordance with the given logical expressions, thereby obtaining a two-level logic data. More specifically, the logical expressions are transformed into a two-level logic as follows:

At step S1 of FIG. 15, the control unit 51 of the logic synthesis and processing unit 50 reads the logical expression data 54 from the input file. The data is temporarily stored in the internal memory of the control unit 51. For example; the logical expression data 54a shown in FIG. 16 is read, and stored in the internal memory.

At step S2, the control unit 51 represents individual terms of the logical expressions by sum-of-products forms 71–74 of FIG. 16, each of which consists of a single cube. Next, the control unit 51 supplies the set data processing unit 60 with literals constituting the sum-of-products forms 71– 74, and operations (a product operation in this case) between those literals, and orders the set data processing unit 60 to compute 0-suppressed binary decision diagrams as shown in FIGS. 17A–17B. The set data processing unit 60 generates the 0-suppressed binary decision diagrams using the 0-suppress method described before. As a result, the contents of the node table 63 change as shown in FIGS. 14A and 14B, and the cubes 71 and 72, and their start addresses N0 and N2 are returned from the set data processing unit 60 to the logic synthesis and processing unit 50 as the calculation results.

Figures 20A, 20B, 20C:
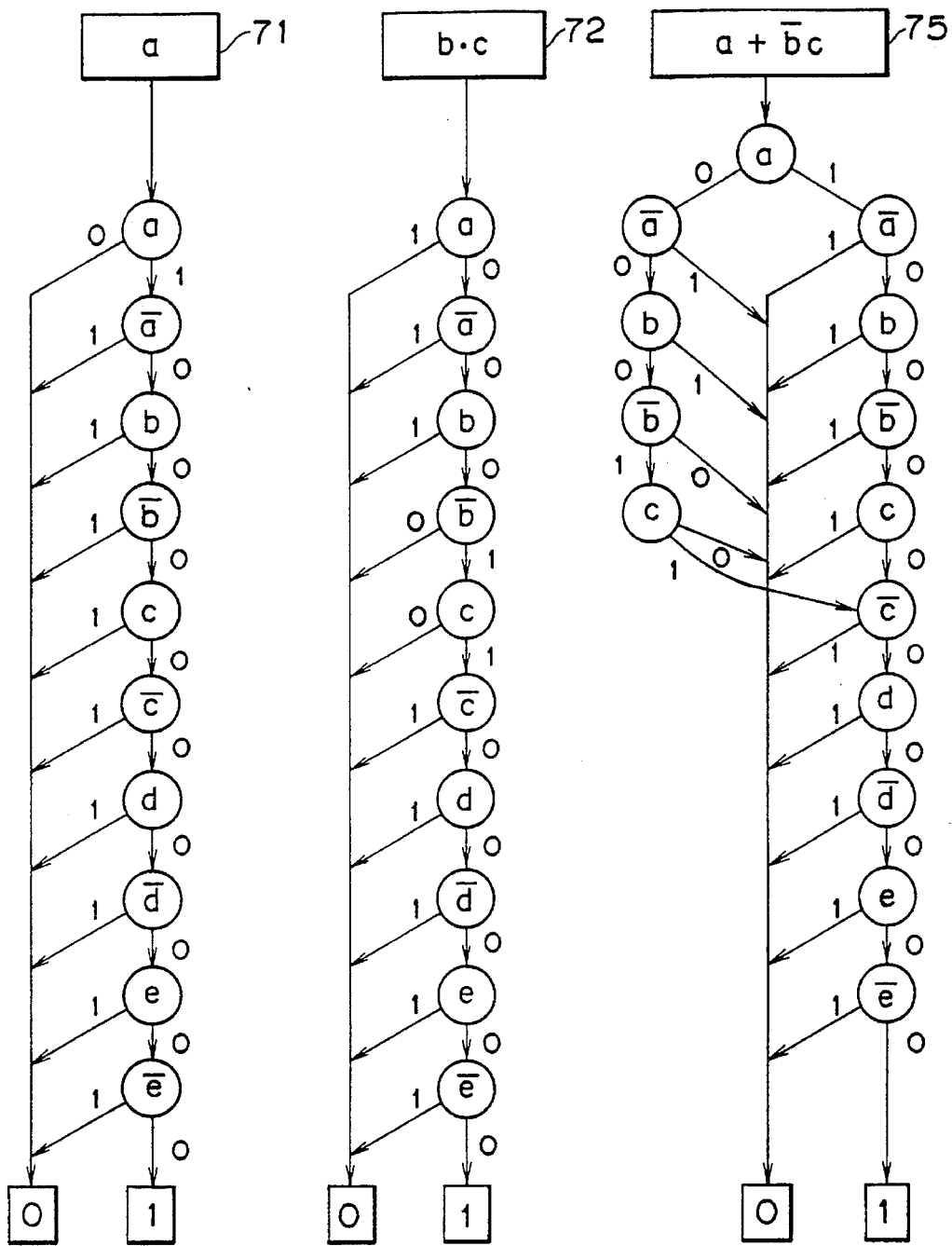
FIGS. 20A–20C show conventional binary decision diagrams representing the sum-of-products forms as shown in FIGS. 17A–17C.

The sum-of-products forms 71 and 72 are represented by the conventional binary decision diagrams as shown in FIGS. 20A and 20B. More specifically, the presence and absence of ten literals of five input variables are associated with 1 and 0 of individual digits of a binary number, thereby representing a cube by the binary number. Thus, the set data of the cube can be represented by the conventional binary decision diagram. Details of this process are described in Chapter 2, pp. 36–38 of "Logic Synthesis and Optimization", edited by Tsutomu Sasao, Kluwer Academic Publishers, 1993.

The same sum-of-products forms 71 and 72 are represented by compact graphs as shown in FIGS. 17A and 17B by the 0-suppress method in accordance with the present invention. This is due to the effect of the 0-suppress node elimination of the present invention described before. This process is executed by the set data processing unit 60.

At step S3 in FIG. 15, the control unit 51 provides the set data processing unit 60 with commands to compute the sum 75 of the cubes 71 and 72, the sum 76 of cubes 73 and 74, and the product 77 of the sums 75 and 76 in accordance with the structure of the logical expressions.

In response to this, the set data processing unit 60 performs the sum and product operation between the cube sets represented by the 0-suppressed binary decision diagrams. Its details are described in the Bryant's paper, pp. 681–687, described before. The operation divides a set into two subsets by substituting 0 and 1 into a variable, so that the operation is separated into operations between the subsets. By iterating the operation for individual variables in accordance with the order recorded in the ordering table, graphs representing the results of the operations are successively generated. The reduction by the node sharing and the 0-suppress node elimination is applied for each one of the operation.

Figure 17C:
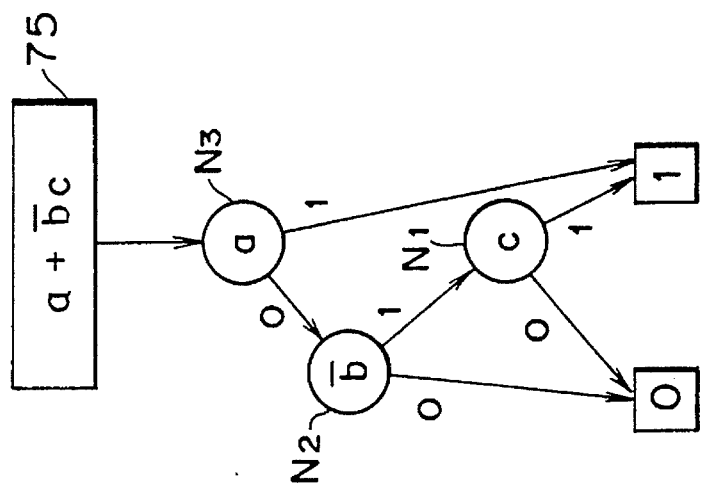
FIGS. 17A–17C are diagrams each illustrating a 0-suppressed binary decision diagram of a sum-of-products form generated in the first embodiment.
Figure 17B:
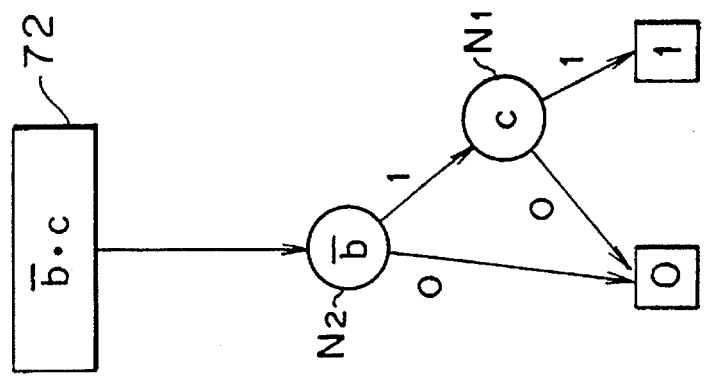
Figure 17A:
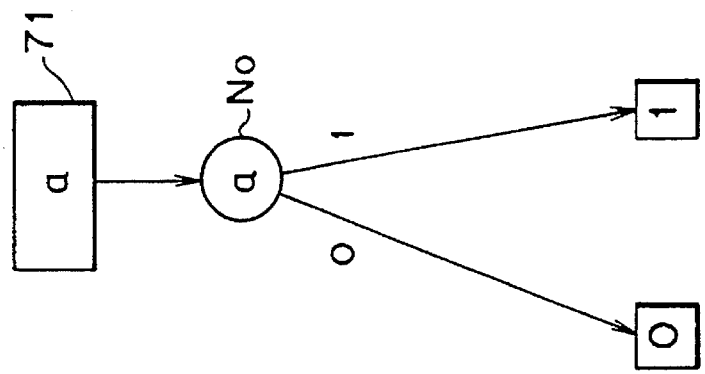
Figure 18B:
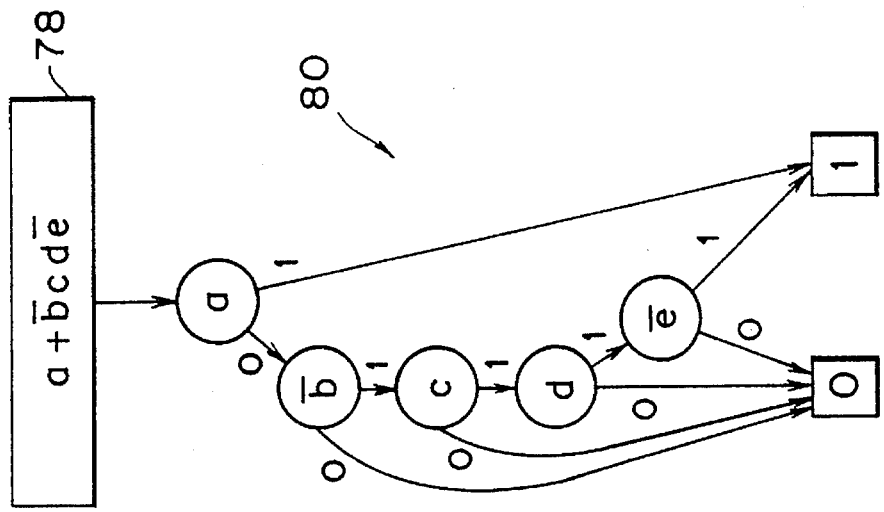
FIGS. 18A and 18B are diagrams each illustrating a 0-suppressed binary decision diagram of a sum-of-products form generated in the first embodiment.
Figure 18A:
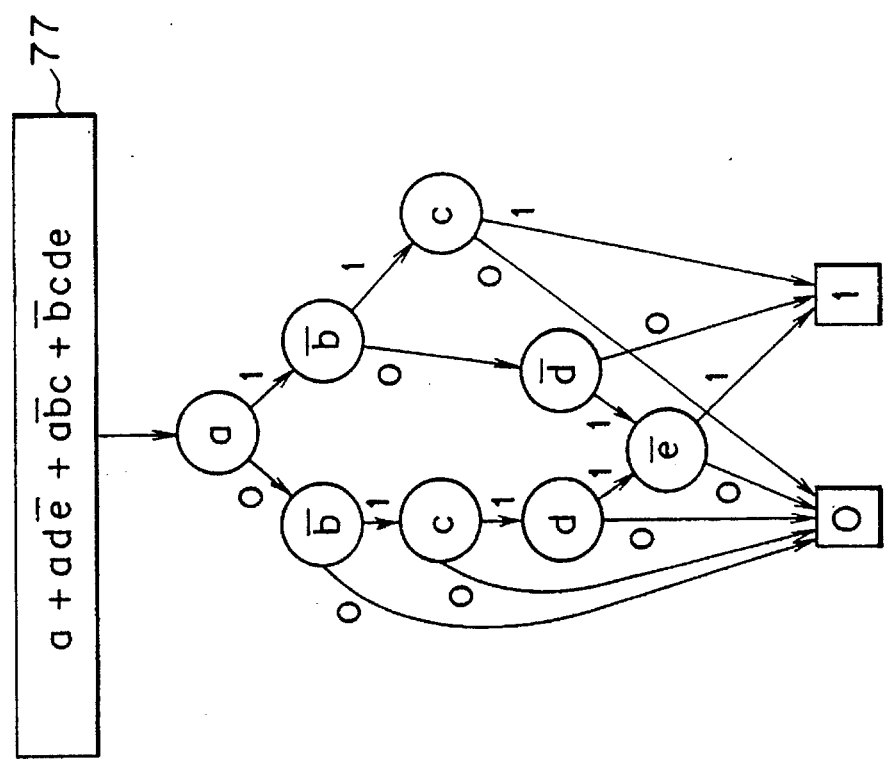

FIGS. 17C and 18A illustrate 0-suppressed binary decision diagrams obtained by the 0-suppress method in accordance with the present invention. The contents of the node table 63 corresponding to the graph of FIG. 17C is shown in FIG. 14C. On the basis of the contents of the node table, the start address N3 of the sum-of-products form 75 is supplied from the set data processing unit 60 to the logic synthesis and processing unit 50 as the calculation result. In a similar manner, the contents of the node table 63 is added with regard to the sum-of-products form 77, and the calculation result is sent to the logic synthesis and processing unit 50. FIGS. 20C and 21A show binary decision diagrams obtained using the conventional node elimination. FIG. 18A shows the graph of the final sum-of-products form 77 representing the logic of the circuit in accordance with the present embodiment, and FIG. 22A shows a graph of the final sum-of-products form 77 representing the logic of the circuit in accordance with the conventional technique.

At step S4 of FIG. 15, the control unit 51 orders the set data processing unit 60 to simplify the sum-of-products form 77. The control unit 61 of the set data processing unit 60 executes the simplification by testing the inclusion relations between the cubes in accordance with the procedures instructed by the control unit 51, thereby generating the simplified 0-suppressed binary decision diagram 80 as shown in FIG. 18B. This simplification itself is known in the art, and is described in "Logic Minimization Algorithms for VLSI Synthesis", by R. K. Brayton, et al , Kluwer Academic Publishers, 1984. The conventional reduction gives the binary decision diagram as shown in FIG. 21B, which is more complicated than the 0-suppressed binary decision diagram 80 of this embodiment.

At step S5, the control unit 51 prepares a circuit diagram based on the simplified 0-suppressed binary decision diagram 80 as shown in FIG. 19. More specifically, the control unit 51 orders the set data processing unit 60 to trace paths of the diagram 80. In response to the command, the control unit 61 of the set data processing unit 60 traces the contents of the node table 63 to find paths extending from the top node to the 1-terminal node t1. In this case, two paths are found. The control unit 51 connects the literals present on each of the two paths to AND gates 81 and 82, respectively, and connects the outputs of the two AND gates to an OR gate 83. In addition, the literals denoting complements are connected to inverters 84 and 85 before connected to the AND gate 82. Finally, the AND gate 81 having only one input is removed. Thus, the circuit diagram as shown in FIG. 16 is obtained.

Finally, at step S6, the control unit 51 outputs the circuit diagram data 56 through the output unit 55.

Although AND gates and an OR gate are used as logic elements in this embodiment, they can be replaced by NAND gates and NOR gates using local, equivalent replacement.

Thus, the present embodiment, using the 0-suppress node elimination, accomplishes the sharp reduction in memory capacity, and saving of computing time. This will be readily understood by comparing the graphs of FIGS. 17A–18B associated with the present embodiment, with the graphs of FIGS. 20A–21B associated with the conventional technique.

EMBODIMENT 2

In a second embodiment, the present invention is applied to a fault diagnosis system. Before describing the second embodiment, the concept of fault propagation will be explained referring to FIG. 22.

Figure 22:
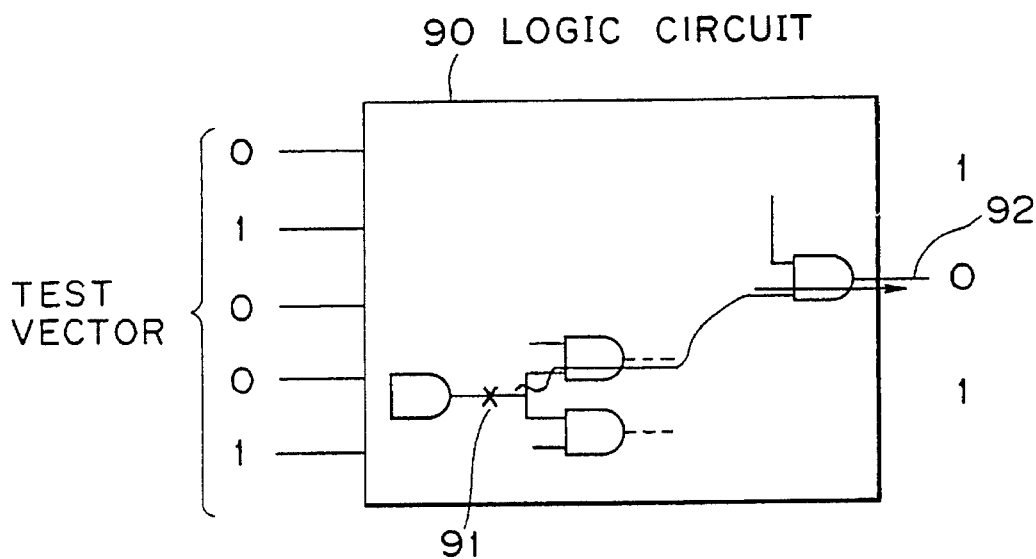
FIG. 22 is a diagram illustrating a fault propagation in an embodiment of a fault diagnosis system in accordance with the present invention.

In FIG. 22, if a test vector applied to a logic circuit 90 causes an output different from a normal value of an output terminal 92, it is found that the logic circuit 90 has some faults in it. Expanding this idea, a problem arises in determining from which fault location to which output signal line a fault propagates when a particular test vector is inputted. For example, if an abnormal output is obtained at the output terminal 92 owing to a fault 91 which fixes a level at 0 or 1, when a particular test vector is inputted, the fault 91 is said to propagate to the output signal line 92 with regard to this test vector.

Figure 23:
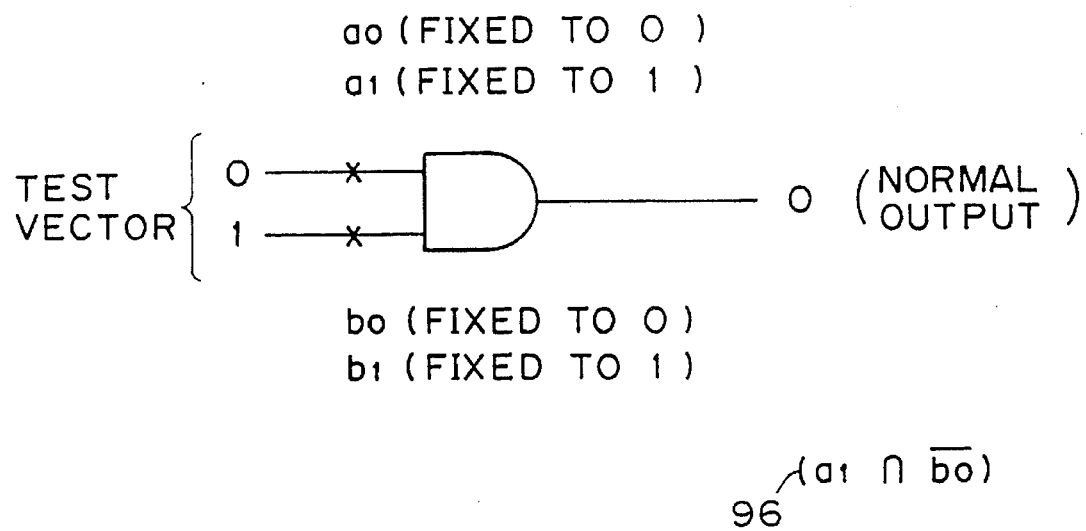
FIG. 23 is a circuit diagram illustrating an example of a fault set associated with an AND gate.

Let us consider the case in which a test vector (0, 1) is inputted to an AND gate 95 of FIG. 23. The fault that fixes a first input of the AND gate 95 at 0 is denoted by a0, and at 1 is designated by a1. Likewise, the fault that fixes a second input of the AND gate 95 at 0 is denoted by b0, and at 1 is designated by b1. In this case, the normal output is 0, and the abnormal output is 1. Thus, the abnormal output is obtained if the first input is fixed at 1, and the second input is not fixed at 0. Accordingly, a fault set 96 is obtained.

Obtaining such fault sets from the input terminals to the output terminals of the logic circuit 90 in terms of individual logic elements will provide fault sets for each output signal line of the logic circuit, and for each test vector. A method for representing such fault sets by the binary decision diagrams is known in the art, and is described in N. Takahashi, et al., "Fault Simulation for Multiple Faults Using Shared BDD Representation of Fault Sets", Processing of IEEE/ACM ICCAD'91, pp. 550–553, 1991. In this embodiment, the fault sets are represented using the 0-suppressed binary decision diagrams in accordance with the present invention described before, instead of the conventional binary decision diagrams.

The fault diagnosis system of this embodiment has a similar arrangement as the design system of a logic circuit as shown in FIG. 12. In this embodiment, binary numbers having the same digits as the number of assumed faults are used, and the values 1 and 0 of each digit of the binary numbers are associated with the presence and absence of the faults to represent coordinations of a plurality of faults. In this case, the ordering table 62 provides the values 0 and 1 of the binary numbers with a fixed order. In addition, circuit diagram data and input signal data of the logic circuit 90 are given instead of the logical expressions 54 of FIG. 12, and simplified fault set data are given instead of the circuit diagram 56.

Figure 24:
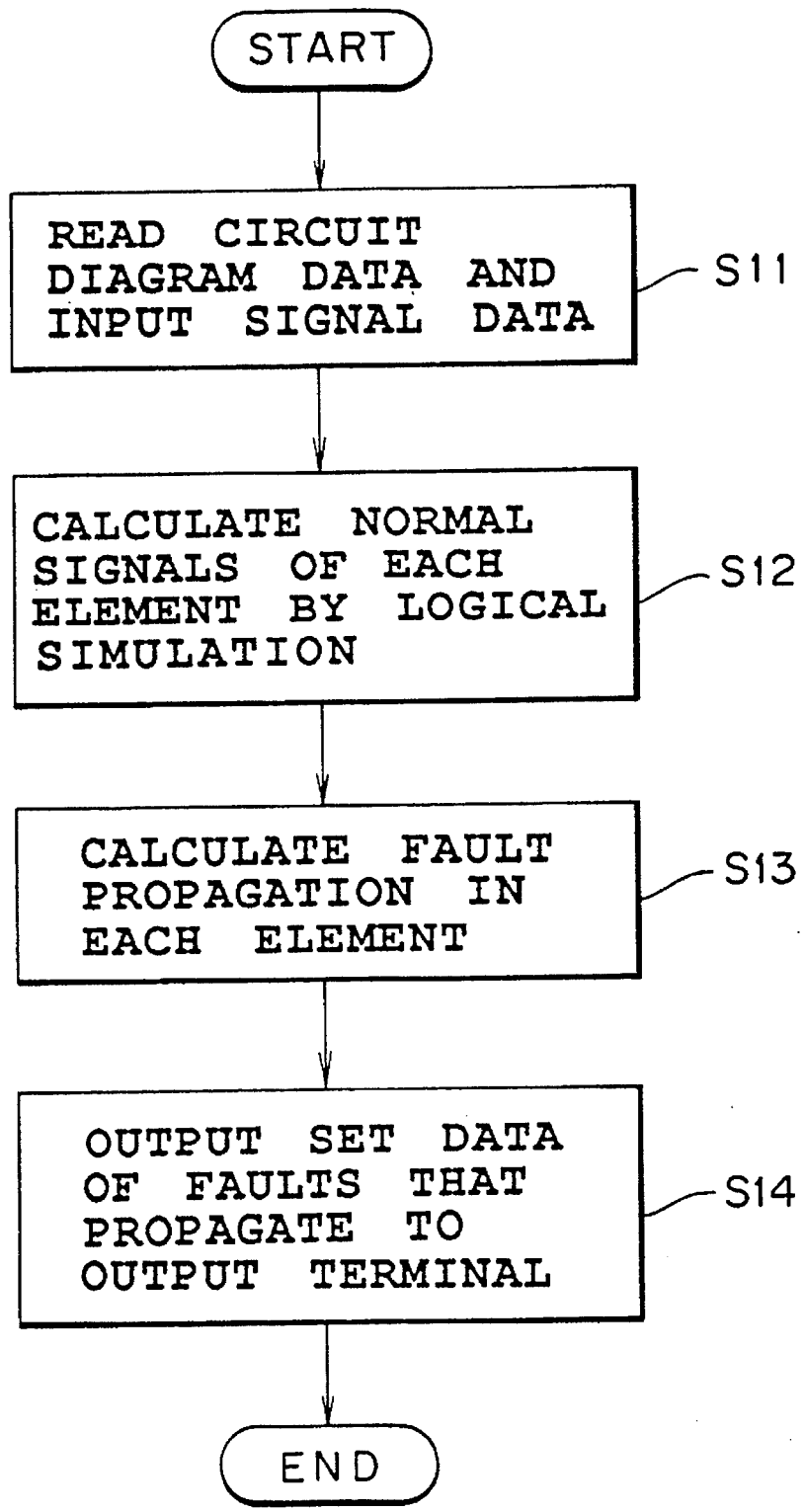
FIG. 24 is a flowchart showing the operation of the embodiment in FIG. 22.

FIG. 24 is a flowchart showing the operation of the fault diagnosis system.

At step S11, the control unit 51 reads the circuit diagram data and the input signal data. The circuit diagram data corresponds to the logic circuit 90, and the input signal data corresponds to the test vector mentioned above.

At step S12, the control unit 51 provides the control unit 61 with a command to calculate the normal signal flow from the input terminals to each output terminal through individual elements. The control unit 61 returns the results to the control unit 51. By iterating such procedures, the normal output of the logic circuit 90 for each input signal data is obtained.

At step S13, the control unit 51 provides the control unit 61 with a command to calculate the fault propagation from the input terminals to each output terminal in terms of each elements. The control unit 61 returns the results to the control unit 51. By iterating such procedures, the fault propagation of the logic circuit 90 is obtained for each input signal data. In other words, fault set data are obtained. The 0-suppress node elimination in accordance with the present invention is employed in this step.

At step S14, the control unit 51 outputs the fault set data through the output unit 55.

The control unit 51 can perform fault diagnosis using the fault sets. For example, when a plurality of test vectors (input signal data) give faults, fault position(s) can be located by computing product of the fault sets obtained by this method.

The 0-suppressed binary decision diagram of this embodiment is much more simplified than the conventional binary decision diagram. This is because most of the digits of the binary numbers representing the fault sets take zero because only a few faults in the entire faults assumed in the logic circuit will occur simultaneously, and hence, the zero suppress of the present invention operates effectively. As a result, both the memory capacity and processing time are greatly reduced in comparison with the conventional binary decision diagram.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A logic function data processing system comprising:

an ordering table providing a fixed order to a plurality of input variables x constituting logic function data;

a node table for storing a binary tree graph consisting of a plurality of intermediate nodes and two types of terminal nodes t0 and t1 representing logic values 0 and 1, respectively, said node table being provided with areas, each of which stores one of said input variables x associated with each one of the intermediate nodes, and two edges e0 and e1 representing destinations obtained by substituting 0 and 1 into the input variable x, respectively;

means for performing an expanding processing that substitutes 0 and 1 into a first input variable x1 recorded in the ordering table to obtain first two subfunctions of the logic function, for performing an expanding processing that substitutes 0 and 1 into a second input variable x2 recorded in the ordering table to obtain second two subfunctions for each of the first two subfunctions, for iterating a similar expanding processing on all the remaining input variables in accordance with the order recorded in the ordering table, for generating the binary tree graph by representing expanded results, which are obtained by the expanding processings, by the intermediate nodes and terminal nodes t0 and t1, and for storing the intermediate nodes and terminal nodes t0 and t1 constituting the binary tree graph into the node table;

means for testing, during the expanding processing and before generating a new intermediate node A and storing it into the node table, whether a node B, which is equivalent to the node A in the sense that the node B has the same input variable x and the same edges e0 and e1 as the node A, is already present in the node table, and for performing sharing, if the equivalent node B is already present in the node table, the nodes A and B by not generating the new node A, and by making an edge pointing to the node A point to the node B; and means for performing, during the expanding processing and if the edge e1 of a new intermediate node A directly points to a terminal node t0, node reduction by not generating the intermediate node A, and by making an edge pointing to the intermediate node A point to a destination of the other edge e0 of the intermediate node A.

2. The logic function data processing system as claimed in claim 1, further comprising a number table that associates subset data with the logic function data, the subset data including given elements of set data consisting of a plurality of elements, said number table including the elements of the set data and different integers equal to or greater than zero which are assigned to each one of the elements, and each of said input variables x being associated with each one of digit positions of a binary number representing each of the integers.

3. The logic function data processing system as claimed in claim 2, wherein said logic function data takes a value 1 when the element, which is associated with the integer number represented in the form of the binary number constituted by the input variables x, belongs to the subset data, and otherwise takes a value 0.

4. A logic circuit design system for designing a logic circuit on the basis of a logic function representing an on-set of the logic circuit, which is represented in the form of a sum of cubes, by representing the cubes by different binary numbers whose number of digits is equal to the total number of literals constituting the cubes, values 1 and 0 of each digit position of the binary numbers being associated with the presence and absence of each one of the literals, said design system comprising:

a number table representing correspondence between the cubes and the binary numbers;

an ordering table providing a fixed order to each one of the literals;

a node table for storing a binary tree graph consisting of a plurality of intermediate nodes and two types of terminal nodes t0 and t1 representing logic values 0 and 1, respectively, said node table being provided with areas, each of which stores one of said literals associated with each one of the intermediate nodes, and two edges e0 and e1 representing destinations obtained by substituting 0 and 1 into the literal, respectively;

means for performing an expanding processing that substitutes 0 and 1 into a first literal recorded in the ordering table to obtain a first two subfunctions of the logic function, for performing an expanding processing that substitutes 0 and 1 into a second literal recorded in the ordering table to obtain a second two subfunctions for each of the first two subfunctions, for iterating a similar expanding processing on all the remaining literals in accordance with the order recorded in the ordering table, for generating the binary tree graph by representing expanded results, which are obtained by the expanding processings, by the intermediate nodes and terminal nodes t0 and t1, and for storing the intermediate nodes and terminal nodes t0 and t1 constituting the binary tree graph into the node table;

means for testing, during the expanding processing and before generating a new intermediate node A and storing it into the node table, whether a node B, which is equivalent to the node A in the sense that the node B has the same literal and the same edges e0 and e1 as the node A, is already present in the node table, and for performing sharing, if the equivalent node B is already present in the node table, of the nodes A and B by not generating the new node A, and by making an edge pointing to the node A point to the node B; and means for performing, during the expanding processing and if the edge e1 of a new intermediate node A directly points to a terminal node t0, node reduction by not generating the intermediate node A, and by making an edge pointing to the intermediate node A point to a destination of the other edge e0 of the intermediate node A.

5. The design system of a logic circuit as claimed in claim 4, further comprising:

means for connecting input terminals of said logic circuit to input terminals of AND elements on a circuit diagram corresponding to the logic circuit in accordance with the literals included in the cubes obtained by the sharing and the node reduction; and means for connecting each of outputs of said AND gates to an OR gate on the circuit diagram.

6. The design system of a logic circuit as claimed in claim 5, further comprising means for generating a circuit using NAND elements and NOR elements, which is equivalent to the circuit represented by the circuit diagram, by performing equivalent replacement on the circuit after generating the circuit combining the AND elements and OR elements.

7. A fault diagnosis system for obtaining a set of faults of a logic circuit when a plurality of faults are assumed to take place in the logic circuit, each of the faults fixing a signal on a signal line of the logic circuit at 0 or 1, and having influence on an output signal of the logic circuit, said set of faults, which makes a signal value on a signal line different from a normal value on the signal line, being sequentially calculated from an input terminal to an output terminal of the logic circuit by using set operations in accordance with the logic of the logic circuit, said fault diagnosis system comprising:

means for associating values 1 and 0 of each digit position of binary numbers, whose number of digits is equal to the total number of faults assumed to take place, with the presence and absence of each one of the faults, thereby representing the set of faults by a logic function;

an ordering table providing a fixed order to each one of the faults;

a node table for storing a binary tree graph consisting of a plurality of intermediate nodes and two types of terminal nodes t0 and t1 representing logic values 0 and 1, respectively, said node table being provided with areas, each of which stores one of said faults associated with each one of the intermediate nodes, and two edges e0 and e1 representing destinations obtained by substituting 0 and 1 into a fault, respectively;

means for performing an expanding processing that substitutes 0 and 1 into a first fault recorded in the ordering table to obtain a first two subfunctions of the logic function, for performing an expanding processing that substitutes 0 and 1 into a second fault recorded in the ordering table to obtain a second two subfunctions for each of the first two subfunctions, for iterating a similar expanding processing on all the remaining faults in accordance with the order recorded in the ordering table, for generating the binary tree graph by representing expanded results, which are obtained by the expanding processings, by the intermediate nodes and terminal nodes t0 and t1, and for storing the intermediate nodes and terminal nodes t0 and t1 constituting the binary tree graph into the node table;

means for testing, during the expanding processing and before generating a new intermediate node A and storing it into the node table, whether a node B, which is equivalent to the node A in the sense that the node B has the same fault and the same edges e0 and e1 as the node A, is already present in the node table, and for performing sharing, if the equivalent node B is already present in the node table, of the nodes A and B by not generating the new node A, and by making an edge pointing to the node A point to the node B; and means for performing, during the expanding processing and if the edge e1 of a new intermediate node A directly points to a terminal node t0, node reduction by not generating the intermediate node A, and by making an edge pointing to the intermediate node A point to a destination of the other edge e0 of the intermediate node A.

8. A logic function data processing method using an ordering table providing a fixed order to a plurality of input variables x constituting logic function data, and a node table for storing a binary tree graph consisting of a plurality of intermediate nodes and two types of terminal nodes t0 and t1representing logic values 0 and 1, respectively, said node table being provided with areas, each of which stores one of said input variables x associated with each one of the intermediate nodes, and two edges e0 and e1 representing destinations obtained by substituting 0 and 1 into the input variable x, respectively, said method comprising the steps of:

performing an expanding processing that substitutes 0 and 1 into a first input variable x1 recorded in the ordering table to obtain a first two subfunctions of the logic function;

performing an expanding processing that substitutes 0 and 1 into a second input variable x2 recorded in the ordering table to obtain a second two subfunctions for each of the first two subfunctions;

iterating a similar expanding processing on all the remaining input variables in accordance with the order recorded in the ordering table;

generating the binary tree graph by representing expanded results, which are obtained by the expanding processings, by the intermediate nodes and terminal nodes t0 and t1;

storing the intermediate nodes and terminal nodes t0 and t1 constituting the binary tree graph into the node table;

testing, during the expanding processing and before generating a new intermediate node A and storing it into the node table, whether a node B, which is equivalent to the node A in the sense that the node B has the same input variable x and the same edges e0 and e1 as the node A, is already present in the node table;

performing sharing, if the equivalent node B is already present in the node table, of the nodes A and B by not generating the new node A, and by making an edge pointing to the node A point to the node B; and performing, during the expanding processing and if the edge e1 of a new intermediate node A directly points to a terminal node t0, node reduction by not generating the intermediate node A, and by making an edge pointing to the intermediate node A point to a destination of the other edge e0 of the intermediate node A.

9. The logic function data processing method as claimed in claim 8, further comprising a number table that associates subset data with the logic function data, the subset data including given elements of set data consisting of a plurality of elements, said number table including the elements of the set data and different integers equal to or greater than zero which are assigned to each one of the elements, and each of said input variables x being associated with each one of digit positions of a binary number representing each of the integers.

10. The logic function data processing method as claimed in claim 9, wherein said logic function data takes a value 1 when the element, which is associated with the integer number represented in the form of the binary number constituted by the input variables x, belongs to the subset data, and otherwise takes a value 0.

11. A logic circuit design method for designing a logic circuit on the basis of a logic function representing an on-set of the logic circuit, which is represented in the form of a sum of cubes, by representing the cubes by different binary numbers whose number of digits is equal to the total number of literals constituting the cubes, values 1 and 0 of each digit position of the binary numbers being associated with the presence and absence of each one of the literals, the design method using a number table representing correspondence between the cubes and the binary numbers, an ordering table providing a fixed order to each one of the literals, and a node table for storing a binary tree graph consisting of a plurality of intermediate nodes and two types of terminal nodes t0 and t1 representing logic values 0 and 1, respectively, said node table being provided with areas, each of which stores one of said literals associated with each one of the intermediate nodes, and two edges e0 and e1 representing destinations obtained by substituting 0 and 1 into the literal, respectively, said design method comprising the steps of:

performing an expanding processing that substitutes 0 and 1 into a first literal recorded in the ordering table to obtain a first two subfunctions of the logic function;

performing an expanding processing that substitutes 0 and 1 into a second literal recorded in the ordering table to obtain a second two subfunctions for each of the first two subfunctions;

iterating a similar expanding processing on all the remaining literals in accordance with the other recorded in the ordering table;

generating the binary tree graph by representing expanded results, which are obtained by the expanding processings, by the intermediate nodes and terminal nodes t0 and t1;

storing the intermediate nodes and terminal nodes t0 and t1 constituting the binary tree graph into the node table;

testing, during the expanding processing and before generating a new intermediate node A and storing it into the node table, whether a node B, which is equivalent to the node A in the sense that the node B has the same literal and the same edges e0 and e1 as the node A, is already present in the node table;

performing sharing, if the equivalent node B is already present in the node table, of the nodes A and B by not generating the new node A, and by making an edge pointing to the node A point to the node B; and performing, during the expanding processing and if the edge e1 of a new intermediate node A directly points to a terminal node t0, node reduction by not generating the intermediate node A, and by making an edge pointing to the intermediate node B point to a destination of the other edge e0 of the intermediate node A.

12. The design method of a logic circuit as claimed in claim 11, further comprising the steps of:

connecting input terminals of said logic circuit to input terminals of AND elements on a circuit diagram corresponding to the logic circuit in accordance with the literals included in the cubes obtained by the sharing and the node reduction; and connecting each of outputs of said AND gates to an OR gates on the circuit diagram.

13. The design method of a logic circuit as claimed in claim 12, further comprising the step of generating a circuit using NAND elements and NOR elements, which is equivalent to the circuit represented by the circuit diagram, by performing equivalent replacement on the circuit after generating the circuit combining the AND elements and OR elements.

14. A fault diagnosis method for obtaining a set of faults of a logic circuit when a plurality of faults are assumed to take place in the logic circuit, each of the faults fixing a signal on a signal line of the logic circuit at 0 or 1, and having influence on an output signal of the logic circuit, said set of faults, which makes a signal value on a signal line different for a normal value on the signal line, being sequentially calculated from an input terminal to an output terminal of the logic circuit by using set operations in accordance with the logic of the logic circuit, the method using an ordering table providing a fixed order to each one of the faults, and a node table for storing a binary tree graph consisting of a plurality of intermediate nodes and two types of terminal nodes t0 and t1 representing logic values 0 and 1, respectively, said node table being provided with areas, each of which stores one of said faults associated with each one of the intermediate nodes, and two edges e0 and e1 representing destinations obtained by substituting 0 and 1 into a fault, respectively, said fault diagnosis method comprising the step of:

associating values 1 and 0 of each digit position of binary numbers, whose number of digits is equal to the total number of faults assumed to take place, with the presence and absence of each one of the faults, thereby representing the set of faults by a logic function;

performing an expanding processing that substitutes 0 and 1 into a first fault recorded in the ordering table to obtain a first two subfunctions of the logic function;

performing an expanding processing that substitutes 0 and 1 into a second fault recorded in the ordering table to obtain a second two subfunctions for each of the first two subfunctions;

iterating a similar expanding processing on all the remaining faults in accordance with the order recorded in the ordering table, for generating the binary tree graph by representing expanded results, which are obtained by the expanding processings, by the intermediate nodes and terminal nodes t0 and t1;

storing the intermediate nodes and terminal nodes t0 and t1 constituting the binary tree graph into the node table;

testing, during the expanding processing and before generating a new intermediate node A and storing it into the node table, whether a node B, which is equivalent to the node A in the sense that the node B has the same fault and the same edges e0 and e1 as the node A, is already present in the node table;

performing sharing, if the equivalent node B is already present in the node table, of the nodes A and by not generating the new node A, and by making an edge pointing to the node A point to the node B; and performing, during the expanding processing and if the edge e1 of a new intermediate node A directly points to a terminal node t0, node reduction by not generating the intermediate node A, and by making an edge pointing to the intermediate node A point to a destination of the other edge e0 of the intermediate node A.

* * * * *